(12) United States Patent
Hahto et al.

(10) Patent No.: US 8,502,161 B2
(45) Date of Patent: Aug. 6, 2013

(54) EXTERNAL CATHODE ION SOURCE

(75) Inventors: Sami K. Hahto, Nashua, NH (US); Richard Goldberg, Oslo (NO); Edward McIntyre, Franklin, MA (US); Thomas N. Horsky, Boxborough, MA (US)

(73) Assignee: SemEquip, Inc., North Billerica, MA (US)

( * ) Notice: Subject to any disclaimer, the term of this patent is extended or adjusted under 35 U.S.C. 154(b) by 167 days.

(21) Appl. No.: 12/776,636

(22) Filed: May 10, 2010

(65) Prior Publication Data

US 2010/0320395 A1    Dec. 23, 2010

Related U.S. Application Data

(60) Continuation of application No. 12/059,608, filed on Mar. 31, 2008, now Pat. No. 7,838,850, and a continuation-in-part of application No. 11/648,506, filed on Dec. 29, 2006, now abandoned, which is a continuation of application No. 10/887,426, filed on Jul. 8, 2004, now Pat. No. 7,185,602, which is a division of application No. 10/170,512, filed on Jun. 12, 2002, now Pat. No. 7,107,929, which is a continuation of application No. PCT/US00/33786, filed on Dec. 13, 2000.

(60) Provisional application No. 60/170,473, filed on Dec. 13, 1999, provisional application No. 60/250,080, filed on Nov. 30, 2000.

(51) Int. Cl.
*H01J 27/08* (2006.01)

(52) U.S. Cl.
USPC ......... 250/423 R; 250/424; 250/426; 250/427

(58) Field of Classification Search
None
See application file for complete search history.

(56) References Cited

U.S. PATENT DOCUMENTS

| | | | |
|---|---|---|---|
| 556,204 A | | 3/1896 | Owen |
| 2,700,107 A | | 1/1950 | Luce |
| 2,773,348 A | | 12/1956 | Grieshaber et al. |
| 3,265,918 A | * | 8/1966 | Wittkower .................... 313/230 |
| 3,627,965 A | * | 12/1971 | Zweig ............................. 219/66 |
| 3,824,390 A | * | 7/1974 | Magyar ......................... 250/294 |
| 3,890,535 A | * | 6/1975 | Gautherin et al. ....... 315/111.01 |
| 3,999,072 A | | 12/1976 | Takagi |
| 4,261,762 A | | 4/1981 | King |
| 4,272,319 A | | 6/1981 | Thode |
| 4,531,077 A | | 7/1985 | Dagenhart |
| 4,633,129 A | | 12/1986 | Cuomo et al. |
| 4,636,680 A | * | 1/1987 | Bills et al. ......................... 313/7 |
| 4,714,834 A | | 12/1987 | Shubaly |
| 4,737,688 A | | 4/1988 | Collins et al. |
| 4,868,992 A | * | 9/1989 | Crafts et al. .................... 33/533 |
| 4,902,572 A | | 2/1990 | Horne et al. |

(Continued)

*Primary Examiner* — Andrew Smyth

(74) *Attorney, Agent, or Firm* — John S. Paniaguas; Katten Muchin Rosenman LLP

(57) ABSTRACT

An ion source is disclosed for use in fabrication of semiconductors. The ion source includes an electron emitter that includes a cathode mounted external to the ionization chamber for use in fabrication of semiconductors. In accordance with an important aspect of the invention, the electron emitter is employed without a corresponding anode or electron optics. As such, the distance between the cathode and the ionization chamber can be shortened to enable the ion source to be operated in an arc discharge mode or generate a plasma. Alternatively, the ion source can be operated in a dual mode with a single electron emitter by selectively varying the distance between the cathode and the ionization chamber.

11 Claims, 27 Drawing Sheets

(56) References Cited

U.S. PATENT DOCUMENTS

| | | |
|---|---|---|
| 5,134,301 A | 7/1992 | Hamata et al. |
| 5,296,713 A | 3/1994 | Tanaka |
| 5,306,921 A * | 4/1994 | Tanaka et al. ............ 250/492.21 |
| 5,306,922 A | 4/1994 | O'Connor |
| 5,320,982 A | 6/1994 | Tsubone et al. |
| 5,483,077 A | 1/1996 | Glavish |
| 5,556,204 A | 9/1996 | Tamura |
| 5,675,152 A | 10/1997 | Wong |
| 5,977,552 A | 11/1999 | Foad |
| 6,037,717 A | 3/2000 | Maishev et al. |
| 6,080,985 A * | 6/2000 | Welkie et al. ................ 250/287 |
| 6,094,012 A | 7/2000 | Leung |
| 6,107,634 A | 8/2000 | Horsky |
| 6,111,260 A | 8/2000 | Dawson et al. |
| 6,195,980 B1 * | 3/2001 | Walther ........................ 60/202 |
| 6,236,054 B1 | 5/2001 | Barna et al. |
| 6,246,059 B1 | 6/2001 | Maishev et al. |
| 6,251,835 B1 * | 6/2001 | Chu et al. ..................... 505/411 |
| 6,271,529 B1 | 8/2001 | Farley et al. |
| 6,288,403 B1 * | 9/2001 | Horsky et al. ................ 250/427 |
| 6,291,940 B1 * | 9/2001 | Scholte Van Mast .... 315/111.81 |
| 6,313,428 B1 | 11/2001 | Chen et al. |
| 6,410,448 B1 | 6/2002 | DeOrnellas et al. |
| 6,452,338 B1 | 9/2002 | Horsky |
| 6,500,314 B1 | 12/2002 | DeOrnellas et al. |
| 6,559,462 B1 | 5/2003 | Carpenter et al. |
| 6,583,544 B1 | 6/2003 | Horsky et al. |
| 6,620,335 B1 | 9/2003 | DeOrnellas et al. |
| 6,664,497 B2 | 12/2003 | Smith et al. |
| 6,744,214 B2 | 6/2004 | Horsky |
| 6,755,150 B2 | 6/2004 | Lai et al. |
| 6,815,633 B1 | 11/2004 | Chen et al. |
| 6,958,481 B2 | 10/2005 | Horsky |
| 7,022,999 B2 | 4/2006 | Horsky |
| 7,107,929 B2 * | 9/2006 | Horsky et al. ............ 118/723 CB |
| 7,112,804 B2 | 9/2006 | Horsky et al. |
| 7,138,768 B2 | 11/2006 | Maciejowski et al. |
| 7,185,602 B2 | 3/2007 | Horsky et al. |
| 7,838,850 B2 * | 11/2010 | Hahto et al. ............. 250/492.21 |
| 2001/0033128 A1 * | 10/2001 | Torti et al. .................. 313/359.1 |
| 2003/0230986 A1 | 12/2003 | Horsky et al. |
| 2004/0002202 A1 | 1/2004 | Horsky et al. |
| 2004/0026628 A1 * | 2/2004 | Schweikhard et al. ... 250/423 R |
| 2004/0188631 A1 | 9/2004 | Horsky et al. |
| 2004/0245476 A1 | 12/2004 | Horsky et al. |
| 2006/0169915 A1 | 8/2006 | Olson et al. |
| 2007/0107841 A1 | 5/2007 | Horsky et al. |
| 2007/0108394 A1 | 5/2007 | Horsky et al. |
| 2008/0073583 A1 * | 3/2008 | Jasinski et al. ........... 250/492.21 |
| 2009/0014667 A1 * | 1/2009 | Hahto et al. ............. 250/492.21 |

* cited by examiner

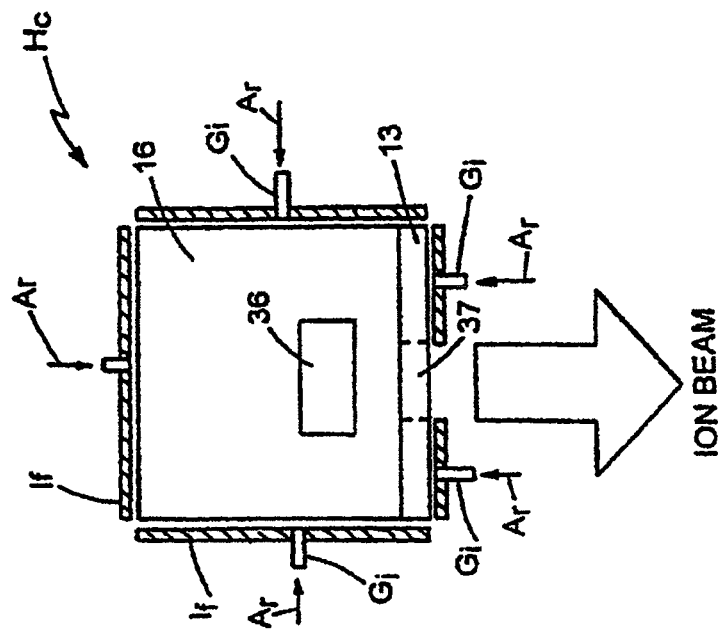
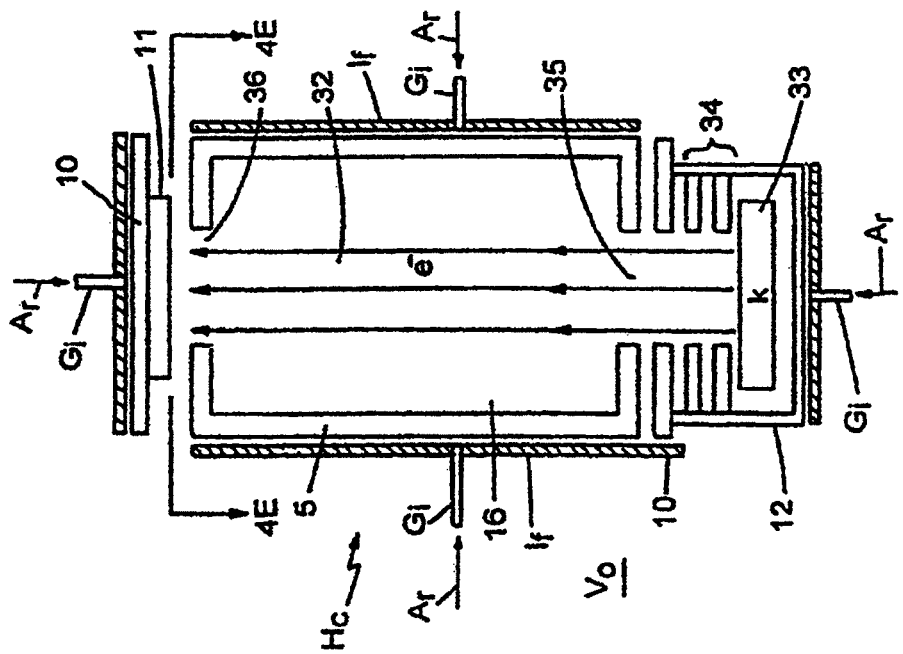
Fig. 4D
Fig. 4E

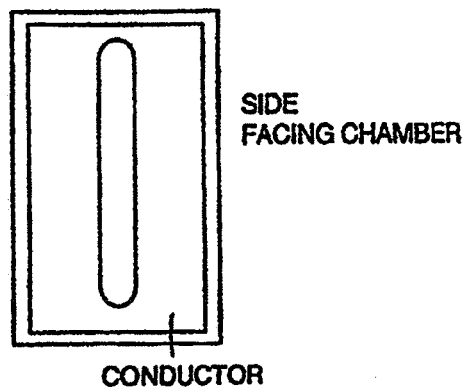
Fig. 12A
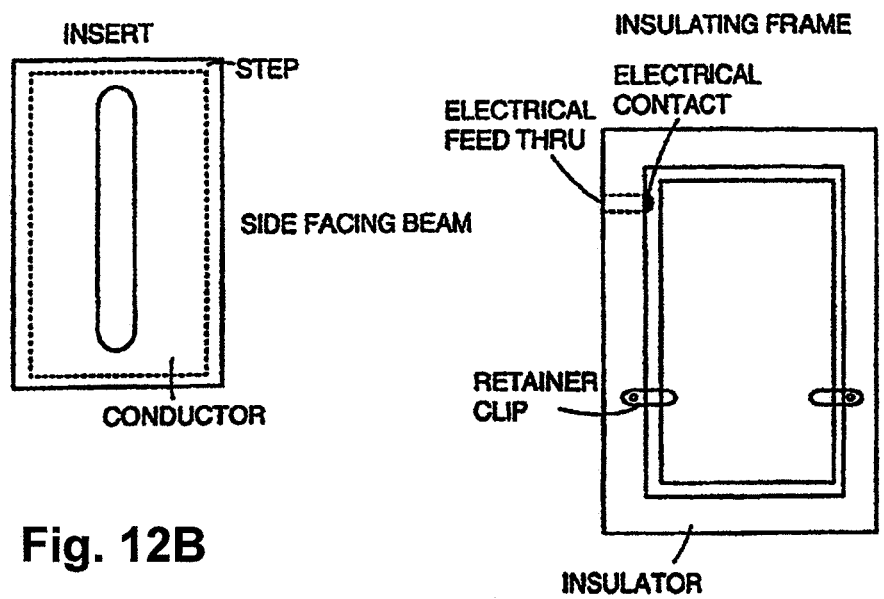
Fig. 12B
Fig. 12C

EXTERNAL CATHODE ION SOURCE

CROSS-REFERENCE TO RELATED APPLICATIONS

This application is a continuation of U.S. patent application Ser. No. 12/059,608 filed Mar. 31, 2008, which is a continuation-in-part of U.S. patent application Ser. No. 11/648,506, filed Dec. 29, 2006, which is a continuation of U.S. patent application Ser. No. 10/887,426, filed on Jul. 8, 2004, now U.S. Pat. No. 7,185,602, which is a divisional of U.S. patent application Ser. No. 10/170,512, filed Jun. 12, 2002, now U.S. Pat. No. 7,107,929, which is a continuation of International Patent Application No. PCT/US00/33786, filed Dec. 13, 2000, which claims priority of and benefit of U.S. Provisional Patent Application No. 60/170,473 filed on Dec. 13, 1999, U.S. Provisional Patent Application No. 60/250,080 filed on Nov. 3, 2000.

BACKGROUND OF THE INVENTION

1. Field of Invention

The present invention relates to an ion source for use in semiconductor fabrication and more particularly to an ion source configured with its cathode located external to the ionization chamber, the ion source being operable in a first mode of operation or may be configured as a dual mode ion source that is selectively operable in both a first mode of operation, such as an arc discharge mode and a second mode of operation, such as a direct electron impact mode of operation, with a single electron emitter that can be used for ionizing gases and vapors and producing monatomic ions in an arc discharge mode of operation and molecular ions, such as cluster ions in a direct electron impact mode of operation.

2. Description of the Prior Art

Electron emitters (also known as electron guns) with both directly heated and indirectly heated cathodes (IHC) are known in the art to be used in ion implantation systems. In known ion implantation systems, electron emitters with such heated and indirectly heated cathodes are normally disposed within an ionization chamber and are therefore subject to a relatively harsh environment as a result of the plasma developed within the ionization chamber. Electron emitters with IHCs offer advantages over those with directly heated cathodes in reliability and life time. In particular, emitters with directly heated cathodes include a relatively small wire that forms a filament. These filaments are known to fail in such harsh environments in a relatively short time. On the other hand, electron emitters which include Indirectly heated cathodes include a relatively massive cathode that is heated indirectly by electron bombardment from a filament. In the case of the IHC electron emitters, the cathode emits electrons thermionically. Although, the IHC is exposed to a harsh plasma environment, the massive cathode having a substantially larger mass than the filament of a directly heated cathode provides a relatively longer life than such directly heated cathodes.

As such, IHC electron emitters are typically used to ionize feed materials in hot arc discharge mode, where the IHC emitter sits inside the ionization chamber. The filament inside the IHC electron emitter is heated with electrical current, and biased into negative potential with respect to the solid emitter block. This allows electrons from the filament to be accelerated into the solid emitter heating it up. The emitter block in turn is biased negatively with respect to the ion source body. When the emitter reaches sufficient temperature, it will start emitting electrons igniting arc discharge between the emitter and the source wall forming plasma.

In order to further increase the operating lifetime of such IHCs, devices have been developed which include a cathode and a filament in which the cathode is located inside the ionization or arc chamber of the ion implantation system while the filament is located outside the ionization chamber, as described in detail in Varian U.S. Pat. No. 7,138,768. With such a configuration, by locating the filament outside the harsh environment of the ionization chamber, the operating lifetime of such IHCs is relatively longer than IHCs which are totally located within the ionization chamber.

In recent development of cluster ion sources, heat management has become increasingly important, as many of the cluster molecules are quite fragile and can be dissociated when exposed to hot surfaces like the IHC emitter. It is thus beneficial to remove the electron emitter form the source and situate it externally, namely, outside the ionization chamber, for example, as disclosed in SemEquip U.S. Pat. No. 7,185,602, hereby incorporated by reference. Also the significant material deposits that some of the cluster materials produce favor the removal of the emitter from the source, as there is a risk of building up flakes that will short the IHC to the ionization chamber potential.

This will change the operational parameters of the emitter somewhat. Now the emitter is removed from the higher gas pressure of the ionization chamber into the usually pumped source housing, where the gas pressure can be an order of magnitude or more lower, striking an arc discharge between the IHC emitter and the source will become more difficult. If plasma is ignited, there will be significant diffusion losses before the bulk of the plasma would get into the ionization chamber. For cluster ionization, the required extracted beam current densities are typically an order of magnitude lower than for traditional atomic implant species. This means that dense plasma is not needed in order to create sufficient ion beam currents. Externally located electron gun which forms an electron beam either from a directly or indirectly heated emitter will be able to inject sufficient electron current into the ionization chamber.

To form an electron beam that can be efficiently injected into the source, i.e, ionization chamber, electron optics are normally used to pull and focus the beam. Typically this means placing an anode electrode between the source and emitter. The electrons are pulled from the emitter with the assistance of the anode potential and accelerated to energy $e*Vcathode+e*Vanode$ going across the emitter-anode gap and through the anode. At the anode-source gap the electron beam is decelerated to $e*Vcath$ and focused by the decel lens effect. This setup will allow for refined tuning of the electron beam current, size and emittance. The downside is that the distance the electrons are traveling will increase by the extent of the anode and anode gap. Typically the anode voltages are higher than the cathode voltage. This can lead into voltage holding issues.

Ion beams are produced from ions extracted from an ion source. An ion source typically employs an ionization chamber connected to a high voltage power supply. The ionization chamber is associated with a source of ionizing energy, such as an arc discharge, energetic electrons from an electron-emitting cathode, or a radio frequency or microwave antenna, for example. A source of desired ion species is introduced into the ionization chamber as a feed material in gaseous or vaporized form where it is exposed to the ionizing energy. Extraction of resultant ions from the chamber through an extraction aperture is based on the electric charge of the ions. An extraction electrode is situated outside of the ionization chamber, aligned with the extraction aperture, and at a voltage below that of the ionization chamber. The electrode draws the ions out, typically forming an ion beam. Depending upon desired use, the beam of ions may be mass analyzed for establishing mass and energy purity, accelerated, focused and subjected to scanning forces. The beam is then transported to its point of use, for example into a processing chamber. As the result of the precise energy qualities of the ion beam, its ions may be implanted with high accuracy at desired depth into semiconductor substrates.

The Ion Implantation Process

The conventional method of introducing a dopant element into a semiconductor wafer is by introduction of a controlled energy ion beam for ion implantation. This introduces desired impurity species into the material of the semiconductor substrate to form doped (or "impurity") regions at desired depth. The impurity elements are selected to bond with the semiconductor material to create electrical carriers, thus altering the electrical conductivity of the semiconductor material. The electrical carriers can either be electrons (generated by N-type dopants) or "holes" (i.e., the absence of an electron), generated by P-type dopants. The concentration of dopant impurities so introduced determines the electrical conductivity of the doped region. Many such N- and P-type impurity regions must be created to form transistor structures, isolation structures and other such electronic structures, which collectively function as a semiconductor device.

To produce an ion beam for ion implantation, a gas or vapor feed material is selected to contain the desired dopant element. The gas or vapor is introduced into the evacuated high voltage ionization chamber while energy is introduced to ionize it. This creates ions which contain the dopant element (for example, in silicon the elements As, P, and Sb are donors or N-type dopants, while B and In are acceptors or P-type dopants). An accelerating electric field is provided by the extraction electrode to extract and accelerate the typically positively charged ions out of the ionization chamber, creating the desired ion beam. When high purity is required, the beam is transported through mass analysis to select the species to be implanted, as is known in the art. The ion beam is ultimately transported to a processing chamber for implantation into the semiconductor wafer.

Similar technology is used in the fabrication of flat-panel displays (FPD's) which incorporate on-substrate driver circuitry to operate the thin-film transistors which populate the displays. The substrate in this case is a transparent panel such as glass to which a semiconductor layer has been applied. Ion sources used in the manufacturing of FPD's are typically physically large, to create large-area ion beams of boron, phosphorus and arsenic-containing materials, for example, which are directed into a chamber containing the substrate to be implanted. Most FPD implanters do not mass-analyze the ion beam prior to its reaching the substrate.

Many ion sources used in ion implanters for device wafer manufacturing are "hot" sources, that is, they operate by sustaining an arc discharge and generating a dense plasma; the ionization chamber of such a "hot" source can reach an operating temperature of 800 C or higher, in many cases substantially reducing the accumulation of solid deposits. In addition, the use of $BF_3$ in such sources to generate boron-containing ion beams further reduces deposits, since in the generation of a $BF_3$ plasma, copious amounts of fluorine ions are generated; fluorine can etch the walls of the ion source, and in particular, recover deposited boron through the chemical production of gaseous $BF_3$. With other feed materials, however, detrimental deposits have formed in hot ion sources. Examples include antimony (Sb) metal, and solid indium (In), the ions of which are used for doping silicon substrates.

A typical commercial ion implanter is shown in schematic in FIG. 1. The ion beam I is shows propagating from the ion source 42 through a transport (i.e. "analyzer") magnet 43, where it is separated along the dispersive (lateral) plane according to the mass-to-charge ratio of the ions. A portion of the beam is focused by the magnet 43 onto a mass resolving aperture 44. The aperture size (lateral dimension) determines which mass-to-charge ratio ion passes downstream, to ultimately impact the target wafer 55, which typically may be mounted on a spinning disk 45. The smaller the mass resolving aperture 44, the higher the resolving power R of the implanter, where $R=M/\Delta M$ (M being the nominal mass-to-charge ratio of the ion and $\Delta M$ being the range of mass-to-charge ratios passed by the aperture 44). The beam current passing aperture 44 can be monitored by a moveable Faraday detector 46, whereas a portion of the beam current reaching the wafer position can be monitored by a second Faraday detector 47 located behind the disk 45. The ion source 42 is biased to high voltage and receives gas distribution and power through feedthroughs 48. The source housing 49 is kept at high vacuum by source pump 50, while the downstream portion of the implanter is likewise kept at high vacuum by chamber pump 51. The ion source 42 is electrically isolated from the source housing 49 by dielectric bushing 52. The ion beam is extracted from the ion source 42 and accelerated by an extraction electrode 53. In the simplest case (where the source housing 49, implanter magnet 43, and disk 45 are maintained at ground potential), the final electrode of the extraction electrode 53 is at ground potential and the ion source is floated to a positive voltage $V_a$, where the beam energy $E=qV_a$ and q is the electric charge per ion. In this case, the ion beam impacts the wafer 55 with ion energy E. In other implanters, as in serial implanters, the ion beam is scanned across a wafer by an electrostatic or electromagnetic scanner, with either a mechanical scan system to move the wafer or another such electrostatic or electromagnetic scanner being employed to accomplish scanning in the orthogonal direction.

As shown, in FIG. 2, a Bernas ion source a is mounted to the vacuum system of the ion implanter through a mounting flange b which also accommodates vacuum feedthroughs for cooling water, thermocouples, feed material as a dopant gas feed, $N_2$ cooling gas, and power. The gas feed c feeds gas into the arc chamber d in which the gas is ionized. Also provided are dual vaporizer ovens e, f in which solid feed materials such as As, $Sb_2O_3$, and P may be vaporized. The ovens, gas feed, and cooling lines are contained within a cooled machined aluminum block g. The water cooling is required to limit the temperature excursion of the aluminum block g while the vaporizers, which operate between 100 C. and 800 C., are active, and also to counteract radiative heating by the arc chamber d when the source is active. The arc chamber d is mounted to the aluminum block g.

The gas introduced to arc chamber d is ionized through electron impact with the electron current, or arc, discharged between the cathode h and the arc chamber d. To increase ionization efficiency, a uniform magnetic field i is established along the axis joining the cathode h and an anticathode j by external Helmholz coils, to provide confinement of the arc electrons. An anticathode j (located within the arc chamber d but at the end opposite the cathode h) is typically held at the same electric potential as the cathode h, and serves to reflect the arc electrons confined by the magnetic field i back toward the cathode h and back again repeatedly. The trajectory of the thus-confined electrons is helical, resulting in a cylindrical plasma column between the cathode h and anticathode j. The plasma density within the plasma column is typically high, on the order of $10^{12}$ per cubic centimeter; this enables further ionizations of the neutral and ionized components within the plasma column by charge-exchange interactions, and also allows for the production of a high current density of extracted ions. The ion source a is held at a potential above ground (i.e., the silicon wafer potential) equal to the accelerating voltage $V_a$ of the ion implanter: the energy of the ions E as they impact the wafer substrate is given by $E=qV_a$, where q is the electric charge per ion.

The cathode h is typically a hot filament or indirectly-heated cathode, which thermionically emits electrons when heated by an external power supply. It and the anticathode are typically held at a voltage $V_c$ between 60V and 150V below the potential of the ion source $V_a$. High discharge currents D can be obtained by this approach, up to 7 A. Once an arc discharge plasma is initiated, the plasma develops a sheath adjacent to the surface of the cathode h (since the cathode h is immersed within the arc chamber and is thus in contact with the resulting plasma). This sheath provides a high electric field to efficiently extract the thermionic electron current for the arc; high discharge currents can be obtained by this method.

If the solid source vaporizer ovens e or f are used, the vaporized material feeds into the arc chamber d through vaporizer feeds k and l, and into plenums m and n. The plenums serve to diffuse the vaporized material into the arc chamber d, and are at about the same temperature as the arc chamber d. In this case a co-gas could be introduced either via tube c into chamber d if the co-gas was from a gaseous stock, It would also be possible to utilize whichever solid vaporizer (e or f) was not in use for, the primary feedstock to generate a co-gas from an appropriate solid material.

Cold ion sources, for example the RF bucket-type ion source which uses an immersed RF antenna to excite the source plasma (see, for example, Leung et al., U.S. Pat. No. 6,094,012, herein incorporated by reference), are used in applications where either the design of the ion source includes permanent magnets which must be kept below their Curie temperature, or the ion source is designed to use thermally-sensitive feed materials which break down if exposed to hot surfaces, or where both of these conditions exist. Cold ion sources suffer more from the deposition of feed materials than do hot sources. The use of halogenated feed materials for producing dopants may help reduce deposits to some extent, however, in certain cases, non-halogen feed materials such as hydrides are preferred over halogenated compounds. For non-halogen applications, ion source feed materials such as gaseous B.sub.2H.sub.6, AsH.sub.3, and PH.sub.3 are used. In some cases, elemental As and P are used, in vaporized form. The use of these gases and vapors in cold ion sources has resulted in significant materials deposition and has required the ion source to be removed and cleaned, sometimes frequently. Cold ion sources which use B.sub.2H.sub.6 and PH.sub.3 are in common use today in FPD implantation tools. These ion sources suffer from cross-contamination (between N- and P-type dopants) and also from particle formation due to the presence of deposits. When transported to the substrate, particles negatively impact yield. Cross-contamination effects have historically forced FPD manufacturers to use dedicated ion implanters, one for N-type ions, and one for P-type ions, which has severely affected cost of ownership.

Recently, cluster implantation ion sources have been introduced into the equipment market (see for example, U.S. Pat. Nos. 6,107,634; 6,288,403; and 6,958,481). U.S. Pat. Nos. 6,452,338; 6,686,595; and. 6,744,214, hereby incorporated by reference, disclose ion sources that are unlike the Bernas-style sources in that they have been designed to produce "clusters", or conglomerates of dopant atoms in molecular form, including ions of the form $As_n^+$, $P_n^+$, or $B_nH_m^+$, where n and m are integers, and $2 \leq n \leq 18$. Such ionized clusters can be implanted much closer to the surface of the silicon substrate and at higher doses relative to their monomer (n=1) counterparts, and are therefore of great interest for forming ultra-shallow p-n transistor junctions, for example in transistor devices of the 65 nm, 45 nm, or 32 nm generations. These cluster sources preserve the parent molecules of the feed gases and vapors introduced into the ion source. The most successful of these have used electron-impact ionization, and do not produce dense plasmas, but rather generate low ion densities at least 100 times smaller than produced by conventional Bernas sources, for example, as disclosed in the cluster ion sources mentioned above The use of $B_{18}H_{22}$ as an implant material for ion implantation of $B_{18}H_x^+$ in making PMOS devices is disclosed in Horsky et al. U.S. Patent Application Publication No. US 2004/0002202 A1, hereby incorporated by reference.

FIG. 3 shows in schematic a cluster ion source 1 as described in more detail in U.S. Pat. No. 6,452,338, hereby incorporated by reference. The vaporizer 2 is attached to the vaporizer valve 3 through an annular metal gasket 4. The vaporizer valve 3 is likewise attached to the ionization chamber 5 by a second annular metal gasket 6. This ensures good thermal conduction between the vaporizer, vaporizer valve, and ionization chamber 5 through intimate contact via thermally conductive elements. A mounting flange 7 attached to the ionization chamber 5 allows mounting of the ion source 1 to the vacuum housing of an ion implanter, and contains electrical feedthroughs (not shown) to power the ion source, and water cooling feedthroughs 8, 9 to cool the ion source. The water feedthroughs 8, 9 circulate water through the source shield 10 to cool the source shield 10 and cool the attached components, the beam dump 11 and electron gun 12 (further described below). The exit aperture 13 is mounted to the ionization chamber 5 face by metal screws (not shown). Thermal conduction of the exit aperture 13 to the ionization chamber 5 is aided by an annular seal 14 which can be made from metal or a thermally conductive polymer.

When the vaporizer valve 3 is in the open position, vaporized gases from the vaporizer 2 can flow through the vaporizer valve 3 to inlet channel 15 into the open volume of the ionization chamber 5. These gases are ionized by interaction with the electron beam transported from the electron gun 12 to the beam dump 11. The ions can then exit the ion source from the exit aperture 13, where they are collected and transported by the ion optics of the ion implanter.

The vaporizer 2 is made of machined aluminum, and houses a water bath 17 which surrounds a crucible 18, wherein resides solid feed materials 19. The water bath 17 is heated by a resistive heater plate 20 and cooled by a heat exchanger coil 21 to keep the water bath at the desired temperature. The heat exchanger coil 21 is cooled by de-ionized water provided by water inlet 22 and water outlet 23. Although the temperature difference between the heating and cooling elements provides convective mixing of the water, a magnetic paddle stirrer 24 continuously stirs the water bath 17 while the vaporizer is in operation. A thermocouple 25 continually monitors the temperature of the crucible 18 to provide temperature feedback for a PID vaporizer temperature controller (not shown). The ionization chamber 5 is made of aluminum, graphite, or molybdenum, and operates near the temperature of the vaporizer 2 through thermal conduction. In addition to low-temperature vaporized solids, the ion source can receive gases through gas feed 26, which feeds directly into the open volume of the ionization chamber 16 by an inlet channel 27. In prior art systems, when the gas feed 26 is used to input feed gases, the vaporizer valve 3 is closed, however, in an embodiment of the invention, the feed material is vaporized in the vaporizer 2 and provided to the chamber 5 as a gas and the co-material gas is also provided to the chamber 5 via gas feed 26. The co-gas is introduced and metered via a commercial mass-flow-controller.

FIG. 4 illustrates the geometry of the ion source with the exit aperture removed; the ion beam axis points out of the plane of the paper. An electron beam 32 is emitted from the cathode 33 and focused by the electron optics 34 to form a wide beam. The electron beam may be asymmetric, in that it is wider perpendicular to the ion beam axis than it is along that axis. The distribution of ions created by neutral gas interaction with the electron beam roughly corresponds to the profile of the electron beam. Since the exit aperture 13 is a wide, rectangular aperture, the distribution of ions created adjacent to the aperture 13 should be uniform. Also, in the ionization of decaborane and other large molecules, it is important to maintain a low plasma density in the ion source This limits the charge-exchange interactions between the ions which can cause loss of the ions of interest. Since the ions are generated in a widely distributed electron beam, this will reduce the local plasma density relative to other conventional ion sources known in the art. The electron beam passes through an entrance channel 35 in the ionization chamber and interacts with the neutral gas within the open volume 16. It then passes through an exit channel 36 in the ionization chamber and is intercepted by the beam dump 11, which is mounted onto the water-cooled source shield 10. Since the heat load generated by the hot cathode 33 and the heat load generated by impact of the electron beam 32 with the beam dump 11 is substantial, these elements, as well as the electron optics or anodes 34, are kept outside of the ionization chamber open volume 16 where they cannot cause dissociation of the neutral gas molecules and ions.

Borohydrides

Borohydride materials such as $B_{10}H_{14}$ (decaborane) and $B_{18}H_{22}$ (octadecaborane) under the right conditions form the ions $B_{10}H_x^+$, $B_{10}H_x^-$, $B_{18}H_x^+$, and $B_{18}H_x^-$. When implanted, these ions enable very shallow, high dose P-type implants for shallow junction formation in CMOS manufacturing. Since these materials are solid at room temperature, they must be vaporized and the vapor introduced into the ion source for ionization. They are low-temperature materials (e.g., decaborane melts at 100 C, and has a vapor pressure of approximately 0.2 Torr at room temperature; also, decaborane dissociates above 350 C), and hence must be used in a cold ion source. They are fragile molecules which are easily dissociated, for example, in hot plasma sources.

Contamination Issues of Borohydrides

Boron hydrides such as decaborane and octadecaborane present a severe deposition problem when used to produce ion beams, due to their propensity for readily dissociating within the ion source. Use of these materials in Bernas-style arc discharge ion sources and also in electron-impact ("soft") ionization sources, have confirmed that boron-containing deposits accumulate within the ion sources at a substantial rate. Indeed, up to half of the borohydride vapor introduced into the source may stay in the ion source as dissociated, condensed material. Eventually, depending on the design of the ion source, the buildup of condensed material interferes with the operation of the source and necessitates removal and cleaning of the ion source.

Contamination of the extraction electrode has also been a problem when using these materials. Both direct ion beam strike and condensed vapor can form layers that degrade operation of the ion beam formation optics, since these boron-containing layers appear to be electrically insulating. Once an electrically insulating layer is deposited, it accumulates electrical charge and creates vacuum discharges, or so-called "glitches", upon breakdown. Such instabilities affect the precision quality of the ion beam and can contribute to the creation of contaminating particles.

It is desirable at times to be able to run an ion implantation system for implanting either monatomic ions or molecular ions, such as cluster ions. U.S. Pat. No. 7,107,929 and US Patent Application Publication No. 2007/0108394 A1, assigned to the same assignee as the present invention, are examples of ion sources that are configured to operate in dual modes and generate monatomic ions in an arc discharge mode of operation and molecular ions, such as cluster ions in a direct electron impact mode of operation. Some known dual mode ion sources are known utilize a first electron emitter which includes a cathode and an associated anode, remote from the ionization chamber which are configured to operate in a direct electron impact mode for the cluster ion feed material and also employ a second electron emitter disposed within the ionization chamber, to ionize the monatomic ion feed material. These electron emitters either use small gaps around the cathode (with remote support insulators) or adjacent insulators to prevent the cathode from shorting out to the ionization chamber. While such dual mode ion sources are a significant improvement over single mode ion sources, the need for multiple electron emitters in a single ion source adds a substantial amount of complexity.

Thus, there is a need to provide an ion implantation system which includes an ion source which includes a single electron emitter, such as an electron emitter that includes a cathode that is located external to the ionization chamber which eliminates the need for an associated anode and which can be used in an arc discharge mode or alternatively incorporated into a dual mode ion source operable in a direct electron impact mode and an arc discharge mode.

SUMMARY OF THE INVENTION

Briefly, the present invention relates to an ion source with an electron emitter that includes a cathode mounted external to the ionization chamber for use in fabrication of semiconductors. In accordance with an important aspect of the invention, the electron emitter is employed without a corresponding anode or electron optics. As such, the distance between the cathode and the ionization chamber can be shortened to enable the ion source to be operated in an arc discharge mode and generate a plasma. Alternatively, the ion source can be operated in a dual mode with a single electron emitter by selectively varying the distance between the cathode and the ionization chamber.

BRIEF DESCRIPTION OF DRAWING

FIG. 3B illustrates the removable feature of the vaporizer of FIG. 3A, using a conventional mounting flange while

FIG. 4 is a side cross-sectional view taken on line 4-4 of FIG. 3 while

FIGS. 4D and 4E, side and top views similar respectively to FIGS. 4 and 4A, show a conductively cooled ionization chamber assembly having a disposable inner ionization chamber.

FIG. 8 illustrates the ion source of FIGS. 3-6 installed in a retrofit volume of a pre-existing ion implanter while

FIG. 9 is a diagram of the operator interface of a conventional Bernas arc discharge ion source while

FIGS. 12A and 12B are side views of the inside face and outside face of an aperture insert plate of another embodiment.

FIG. 12C is a side view of an insulator frame into which the insert plate of FIGS. 20A and 20B may be mounted.

DETAILED DESCRIPTION

Figure 1:
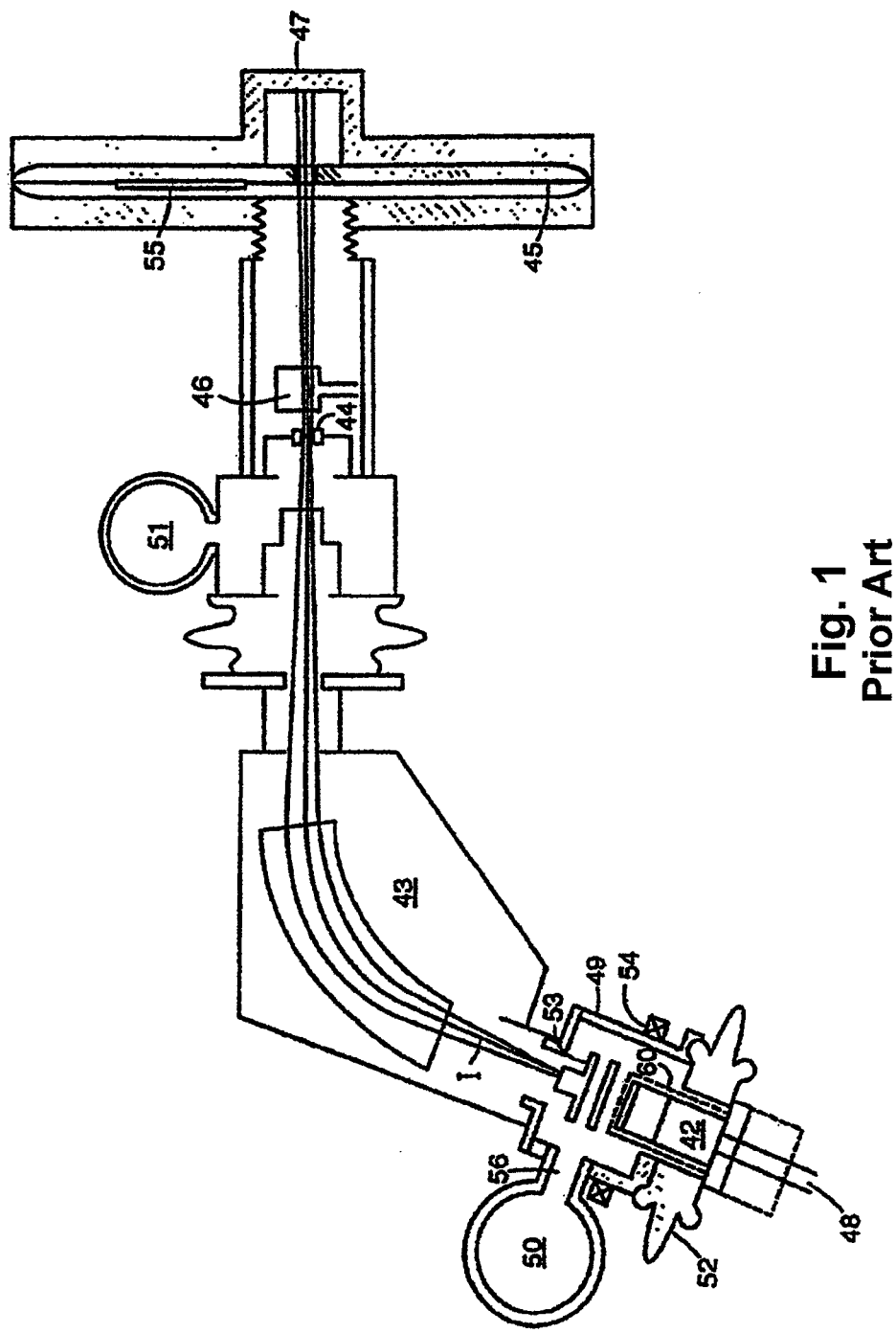
FIG. 1 is a diagrammatic view of a prior art ion implanter.
Figure 2:
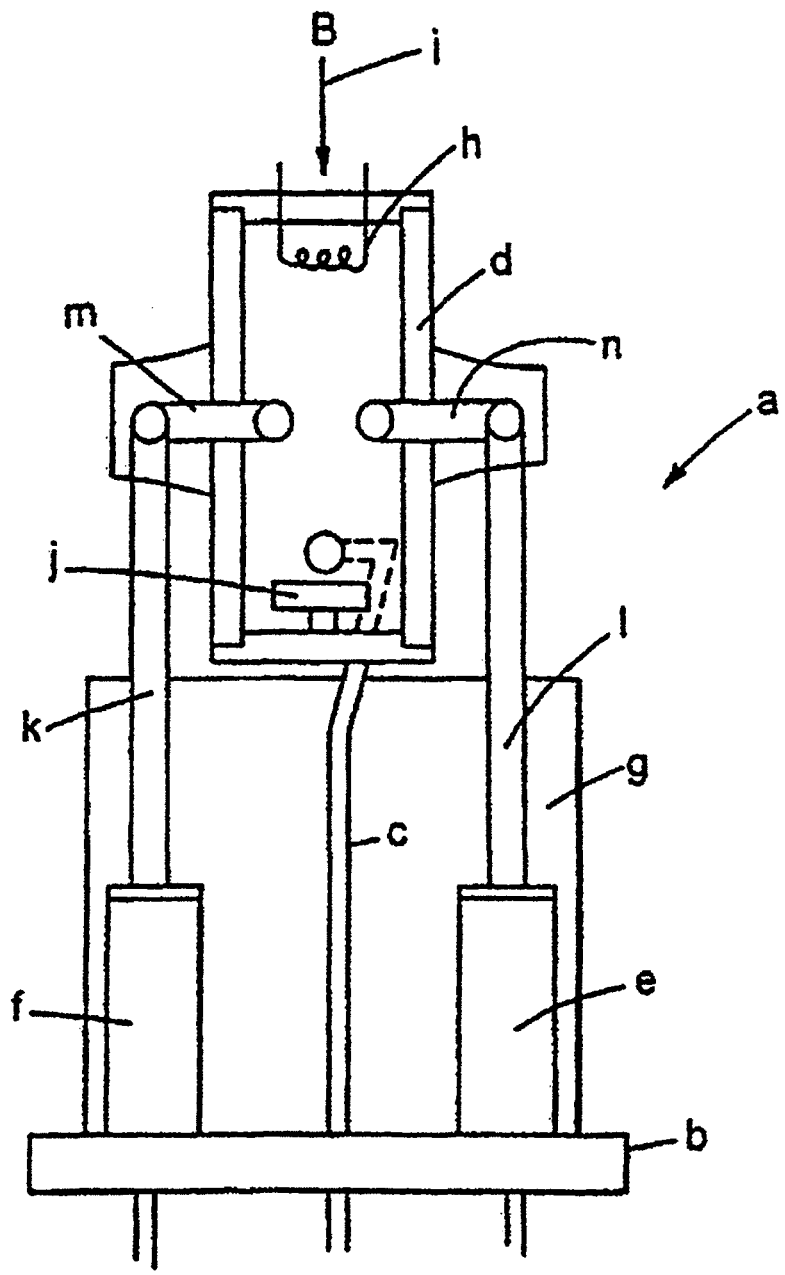
FIG. 2 is a diagrammatic cross-sectional view of a Bernas arc discharge ion source, illustrative of the ion source for which the implanter of FIG. 1 was designed.

The present invention relates to an ion source which includes a single electron emitter that is configured with a cathode mounted external to the ionization chamber for use in fabrication of semiconductors. The ionization chamber is formed with an electron entrance aperture in one wall thereof. In accordance with one aspect of the invention, the cathode portion of the electron emitter, which may be either directly heated or indirectly heated, is located external to the ionization chamber. The cathode is juxtaposed so that emitted electrons are received by the electron entrance aperture and directed into the ionization chamber in order to ionize feed gases or vapors within the ionization chamber. In accordance with an important aspect of the present invention, the anode or other electron optics normally associated with the electron emitter are eliminated to enable the distance, i.e. gap, between the electron emitter and the ionization to be shortened. By shortening this distance, the ion source can be configured to operate in an arc discharge mode with an electron emitter that is completely external to the ionization chamber, thereby removing the entire electron emitter from the harsh plasma environment within the ionization chamber.

In accordance with another important aspect of the invention, the ion source may be operated in both a direct electron mode of operation and an arc discharge mode of operation utilizing a single electron emitter. In this embodiment, the electron emitter is selectively located at a first distance from the ionization chamber for operation in an arc discharge mode and at a second distance for operation in a direct electron impact mode. In this embodiment, the electron emitter may be movably mounted and selectively secured to a desired position relative to the ionization chamber. Alternatively, the electron emitter can be rigidly mounted to a desired position. Accordingly, depending on the distance between the cathode and the ionization chamber, the ion source can be operated in a dual mode by selectively varying the distance between the cathode and the ionization chamber.

The salient aspects of the present invention that relate to an ion source with a single electron emitter with an cathode external to the ionization chamber operable in single mode of operation or a dual mode of operation are illustrated in FIGS. 13-17 and described below. FIGS. 1-12 illustrate the general principles of an ion source that are applicable to the present invention.

GENERAL DESCRIPTION

The ion source may include i) a vaporizer, ii) a vaporizer valve, iii) a gas feed, iv) an ionization chamber, v) an electron gun, vi) a cooled mounting frame, and vii) an ion exit aperture. Included are means for introducing gaseous feed material into the ionization chamber, means for vaporizing solid feed materials and introducing their vapors into the ionization chamber, means for ionizing the introduced gaseous feed materials within the ionization chamber, and means for extracting the ions thus produced from an ion exit aperture adjacent to the ionization region. In addition, means for accelerating and focusing the exiting ions are provided. The vaporizer, vaporizer valve, gas feed, ionization chamber, electron gun, cooled mounting frame, and ion exit aperture are all integrated into a single assembly in the ion source. Each of the features of the ion source is described below.

Vaporizer: The vaporizer is suitable for vaporizing solid materials, such as decaborane ($B_{10}H_{14}$) and TMI (trimethyl indium), which have relatively high vapor pressures at room temperature, and thus vaporize at temperatures below 100 C. The temperature range between room temperature and 100 C is easily accommodated by embodiments in which the vaporizer is directly associated with a water heat transfer medium, while other preferred arrangements accommodate novel material which produce significant vapor pressures in the range up to 200 C. For example, solid decaborane has a vapor pressure of about 1 Torr at 20 C. Most other implant species currently of interest in the ion implantation of semiconductors, such as As, P, Sb, B, C, Ar, N, Si, and Ge are available in gaseous forms. However, $B_{10}$ and In are not, but can be presented in vapors from solid decaborane and TMI. The vaporizer of an embodiment of the invention is a machined aluminum block in which resides a sealed crucible containing the solid material to be vaporized, entirely surrounded by a closed-circuit water bath, which is itself enclosed by the aluminum block. The bath is held at a well-defined temperature by a closed-loop temperature control system linked to the vaporizer. The closed-loop temperature control system incorporates a PID (Proportional Integral Differential) controller. The PID controller accepts a user-programmable temperature setpoint, and activates a resistive heater (which is mounted to a heater plate in contact with the water bath) to reach and maintain it's setpoint temperature through a thermocouple readback circuit which compares the setpoint and readback values to determine the proper value of current to pass through the resistive heater. To ensure good temperature stability, a water-cooled heat exchanger coil is immersed in the water bath to continually remove heat from the bath, which reduces the settling time of the temperature control system. The temperature difference between the physically separate heater plate and heat exchanger coil provides flow mixing of the water within the bath through the generation of convective currents. As an added mixing aid, a rotating magnetic mixer paddle can be incorporated into the water bath. Such a temperature control system is stable from 20 C to 100 C. The flow of gas from the vaporizer to the ionization chamber is determined by the vaporizer temperature, such that at higher temperatures, higher flow rates are achieved.

The flow of gas from a vaporizer to the ionization chamber is determined by the vaporizer temperature, such that at higher temperatures, higher flow rates are achieved.

The vaporizer communicates with the ionization chamber via a relatively high-conductance path between the crucible and the ionization chamber. This may be achieved by incorporating a relatively short, large-diameter, line-of-sight conduit between the two components. High-conductance gate valves (large diameter gates with a thin dimensioned housing) are used in the flow path between the vaporizer and source body, so as not to limit this conductance. By providing a high conductance for the transport of vapor to the ionization chamber, the pressure within the vaporizer and the temperature excursion required are lower than in prior vaporizers.

In one embodiment of the ion source, a relatively low conductance supply path is achieved employing a 5 mm diameter, 20 cm long conduit, providing a conductance of about $7 \times 10^{-2}$ l/s between crucible and ionization chamber. This would require a pressure within the vaporizer of about 2 Torr to establish an ionization chamber pressure of about 4.5 mTorr. Another embodiment employs an 8mm diameter conduit of the same length, providing a conductance of about $3 \times 10^{-1}$ L/s, allowing a pressure within the vaporizer of 0.5 Torr to achieve the same flow rate of material, and hence the same pressure of 4.5 mTorr within the ionization chamber.

The static vapor pressure of a material at a given temperature and the dynamic pressure in the vaporizer crucible during the evolution and transport of vapor out of the crucible during operation are not the same. In general, the steady-state dynamic pressure is lower than the static vapor pressure, the extent depending on the distribution of source material within the vaporizer crucible, in addition to other details of construction. According to the invention, the conductances are made large to accommodate this effect. In addition, in certain preferred embodiments, the added openness of the ionization chamber to the vacuum environment of the source housing due to electron entrance and exit ports into the ionization chamber requires about twice the flow of gaseous material as a conventional Bernas-style source. Generally according to the invention, it is preferred that the conductance be in the range of about $3 \times 10^{-2}$ to $3 \times 10^{-1}$ l/s, preferably the length of the conduit being no less than 30 cm while its diameter is no less than about 5 mm, the preferred diameter range being between 5 and 10 mm. Within these limits it is possible to operate at much lower temperatures than conventional vaporizers, no large addition of temperature being required to elevate the pressure to drive the flow to the ionization chamber. Thus the temperature-sensitive materials are protected and a broad range of materials are enabled to be vaporized within a relatively small temperature range.

In several of the embodiments of the vaporizer presented, the construction of the vaporizer, following these guidelines, allows operation at temperatures between 20 C and 100 C or 200 C. Given the high conductance of the vaporizer, and such temperature ranges, I have realized that the wide range of solid source materials that can be accommodated include some materials which have not previously been used in ion implantation due to their relatively low melting point. (It generally being preferred to produce vapors from material in solid form).

An additional advantage of enabling use of only a relatively low pressure of vaporized gas within the crucible is that less material can be required to establish the desired mass flow of gas than in prior designs.

In another embodiment a different vaporizer PID temperature controller is employed. In order to establish a repeatable and stable flow, the vaporizer PID temperature controller receives the output of an ionization-type pressure gauge which is typically located in the source housing of commercial ion implanters to monitor the sub-atmospheric pressure in the source housing. Since the pressure gauge output is proportional to the gas flow into the ion source, its output can be employed as the controlling input to the PID temperature controller. The PID temperature controller can subsequently raise or diminish the vaporizer temperature, to increase or decrease gas flow into the source, until the desired gauge pressure is attained. Thus, two useful operating modes of a PID controller are defined: temperature-based, and pressure-based.

In another embodiment, these two approaches are combined such that short-term stability of the flow rate is accomplished by temperature programming alone, while long-term stability of the flow rate is accomplished by adjusting the vaporizer temperature to meet a pressure set-point. The advantage of such a combined approach is that, as the solid material in the vaporizer crucible is consumed, the vaporizer temperature can be increased to compensate for the smaller flow rates realized by the reduced surface area of the material presented to the vaporizer.

In another embodiment of the vaporizer, a fluid heat transfer medium is not used. Rather than a water bath, the crucible is integral with the machined body of the vaporizer, and heating and cooling elements are embedded into the aluminum wall of the vaporizer. The heating element is a resistive or ohmic heater, and the cooling element is a thermoelectric (TE) cooler. The vaporizer is also encased in thermal insulation to prevent heat loss to the ambient, since the desired vaporizer temperature is typically above room temperature. In this embodiment, the heating/cooling elements directly determine the temperature of the walls of the vaporizer, and hence the temperature of the material within the crucible, since the material is in direct contact with the walls of the vaporizer which is e.g. machined of a single piece of aluminum. The same PID temperature controller techniques can be used as in the previously described embodiment, enabling the vaporizer to reach a temperature in excess of 100 C, preferably up to about 200 C.

In another embodiment, the vaporizer consists of two mating, but separate components: a vaporizer housing and a crucible. The crucible is inserted into the housing with a close mechanical fit. The surface of the vaporizer housing which makes contact with the crucible contains a pattern of rectangular grooves, into which sub-atmospheric pressurized conductive gas is introduced. The pressurized gas provides sufficient thermal conductivity between the crucible and the temperature-controlled housing to control the temperature of the crucible surface in contact with decaborane or other solid feed material to be vaporized. This embodiment allows the crucible to be easily replaced during service of the vaporizer. The same PID temperature controller techniques can be used as in the previously described embodiment.

In some embodiments, the vaporizer, while still close to the ionization chamber, communicating with it through a high conductance path, is physically located outside of, and removably mounted to, the main mounting flange of the ion source and the vaporizer communicates through the main mounting flange to the ionization chamber located within the vacuum system.

In some embodiments, two vaporizers, independently detachable from the remainder of the ion source, are provided, enabling one vaporizer to be in use while the other, detached, is being recharged or serviced.

Vaporizer Valve

In the above described vaporizer embodiments, the vapors leave the vaporizer and enter the adjacent ionization chamber of the ion source through an aperture, which is preferably coupled to a thin, high conductance gate valve with a metal seal or other thermally conductive seal placed between the vaporizer and ionization chamber. The gate valve serves to separate the vaporizer from the ionization chamber, so that no vapor escapes from the vaporizer when the valve is shut, but a short, high-conductance line-of-sight path is established between the ionization chamber and vaporizer when the valve is open, thus allowing the vapors to freely enter the ionization chamber. With the valve in the closed position, the vaporizer with the valve attached may be removed from the ion source without releasing the toxic vaporizer material contained in the crucible. The ion source may then be sealed by installing a blank flange in the position previously occupied by the vaporizer valve. In another embodiment, two isolation valves are provided in series, one associated with the removable vaporizer and one associated with all of the other components of the ion source, with the disconnect interface being located between the two valves. Thus both parts of the system can be isolated from the atmosphere while the parts are detached from one another. One of the mating valves (preferably, the valve isolating the ion source body) has a small, valved roughing port integrated internal to the valve body, which enables the air trapped in the dead volume between them to be evacuated by a roughing pump after the two valves are mated in a closed position. If the source housing of the implanter is under vacuum, the vaporizer can be installed with its valve in a closed state after being refilled. It is mated to the closed valve mounted to the ion source in the implanter. The vaporizer valve can then be opened and the vaporizer volume pumped out through the roughing port (along with the gas trapped in the dead volume between the valves). Then the ion source valve can be opened, without requiring venting of the source housing. This capability greatly reduces the implanter down time required for servicing of the vaporizer. In another system, two such vaporizers, each with two isolation valves in series, as described, are provided in parallel, suitable to vaporize different starting materials, or to be used alternatively, so that one may be serviced and recharged while the other is functioning.

Gas Feed

In order to operate with gaseous feed materials, ion implanters typically use gas bottles which are coupled to a gas distribution system. The gases are fed to the ion source via metal gas feed lines which directly couple to the ion source through a sealed VCR or VCO fitting. In order to utilize these gases, embodiments of the ion source of the present invention likewise have a gas fitting which couples to the interior of the ionization chamber and connects to a gas distribution system.

Ionization Chamber

The ionization chamber defines the region to which the neutral gas or vapor fed to the source is ionized by electron impact. In certain embodiments, the ionization chamber is in intimate thermal and mechanical contact with the high conductance vaporizer valve or valves through thermally conductive gaskets, which are likewise in intimate thermal contact with the vaporizer through thermally conductive gaskets. This provides temperature control of the ionization chamber through thermal contact with the vaporizer, to avoid heat generated in the ionization chamber from elevating the temperature of the walls of the chamber to temperatures which can cause decaborane or other low-temperature vaporized materials or gases to break down and dissociate.

In other embodiments, the ionization chamber, as a removable component, (advantageously, in certain instances, a regularly replaced consumable component) is maintained in good heat transfer relationship with a temperature-controlled body, such as a temperature controlled solid metal heat sink having a conventional water cooling medium or being cooled by one or more thermoelectric coolers.

The ionization chamber in some embodiments is suitable for retrofit installation is sized and constructed to provide an ionization volume, extraction features, and ion optical properties compatible with the properties for which the target implanter to be retrofitted was designed.

In some embodiments, the ionization chamber is rectangular, made of a single piece of machined aluminum, molybdenum, graphite, silicon carbide or other suitable thermally conductive material. Because contact of the ionization chamber with a fluid transfer medium is avoided in designs presented here, in certain instances the ionization chamber and extraction aperture are uniquely formed of low cost graphite, which is easily machined, or of silicon carbide, neither of which creates risk of transition metals contamination of the implant. Likewise for the low temperature operations (below its melting point) an aluminum construction may advantageously be employed. A disposable and replaceable ionization chamber of machined graphite or of silicon carbide is a particular feature of the invention.

The ionization chamber in some embodiments is approximately 7.5 cm tall by 5 cm wide by 5 cm deep, approximating the size and shape of commercially accepted Bernas arc discharge ionization chambers. The chamber wall thickness is approximately 1 cm. Thus, the ionization chamber has the appearance of a hollow, rectangular five-sided box. The sixth side is occupied by the exit aperture. The aperture can be elongated as are the extraction apertures of Bernas arc discharge ion sources, and located in appropriate position in relation to the ion extraction optics. The flow rate of the gas fed into the ionization chamber is controlled to be sufficient to maintain proper feed gas pressure within the ionization chamber. For most materials, including decaborane, a pressure between 0.5 mTorr and 5 mTorr in the ionization chamber will yield good ionization efficiency for the system being described. The pressure in the source housing is dependent upon the pressure in the ionization chamber. With the ionization chamber pressure at 0.5 mTorr or 5 mTorr, the ion gauge mounted in the source housing, typically used in commercial ion implanters to monitor source pressure, will read about $1 \times 10^{-5}$ Torr and $1 \times 10^{-4}$ Torr, respectively. The flow rate from the vaporizer or gas feed into the ionization chamber required to sustain this pressure is between about 1 sccm and 10 sccm (standard cubic centimeters per minute).

Electron Gun

Except as mentioned below, the general principles of an electron gun suitable for use with the invention illustrated in FIGS. 13-17 are generally described below. However, those embodiments of the electron gun, for example, as illustrated in FIGS. 4, 4B, 4C, which illustrate an anode 34 or other electron optics between the cathode 33 and the electron entrance aperture 35 are not applicable to the invention illustrated in FIGS. 13-17 and are provided to provide a better understanding of the invention.

For ionizing the gases within the ionization chamber, electrons of controlled energy and generally uniform distribution are introduced into the ionization chamber by a broad, generally collimated beam electron gun as shown in the illustrative figures described below. A high-current electron gun is mounted adjacent one end of the ionization chamber, external to that chamber, such that a directed stream of primary energetic electrons is injected through an open port into the ionization chamber along the long axis of the rectangular chamber, in a direction parallel to and adjacent the elongated ion extraction aperture. The cathode of the electron gun is held at an electric potential below the potential of the ionization chamber by a voltage equal to the desired electron energy for ionization of the molecules by the primary electrons. Two ports, respectively in opposite walls of the ionization chamber are provided to pass the electron beam, one port for entrance of the beam as mentioned above, and the second port for exit of the beam from the ionization chamber. After the electron beam exits the ionization chamber, it may be intercepted by a beam dump located just outside of the ionization chamber; the beam dump being aligned with the electron entry point, and preferably maintained at a potential somewhat more positive than that of the ionization chamber. The electron beam is of an energy and current that can be controllably varied over respective ranges to accommodate the specific ionization needs of the various feed materials introduced into the ionization chamber, and the specific ion currents required by the ion implant processes of the end-user. In particular embodiments, the electron gun is constructed to be capable of providing electron beam energy programmable between 20 eV and 500 eV.

The lowest beam energies in this energy range accommodate selective ionization of a gas or vapor below certain ionization threshold energies, to limit the kinds of end-product ions produced from the neutral gas species. An example is the production of $B_{10}H_x^+$ ions without significant production of $B_9H_x^+$, $B_8H_x^+$, or other lower-order boranes frequently contained in the decaborane cracking pattern when higher electron impact energies are used.

The higher beam energies in the energy range of the electron gun are provided to accommodate the formation of multiply-charged ions, for example, $As^{++}$ from $AsH_3$ feed gas. For the majority of ion production from the various feed gases used in semiconductor manufacturing, including the production of $B_{10}H_x^+$ from decaborane, an electron beam energy between 50 eV and 150 eV can yield good results.

In some embodiments, the electron gun is so constructed that the electron beam current can be selected over a range of injected electron beam currents between 0.1 mA and 500 mA, in order to determine the ion current extracted from the ion source in accordance with the implant demand. Control of electron current is accomplished by a closed-loop electron gun controller which adjusts the electron emitter temperature and the electron gun extraction potential to maintain the desired electron current setpoint. The electron emitter, or cathode, emits electrons by thermionic emission, and so operates at elevated temperatures. The cathode may be directly heated (by passing an electric current through the cathode material), or indirectly heated. Cathode heating by electron bombardment from a hot filament held behind the cathode is an indirect heating technique well-practiced in the art. The cathode may be made of tungsten, tantalum, lanthanum hexaboride ($LaB_6$), or other refractory conductive material. It is realized that $LaB_6$ offers a particular advantage, in that it emits copious currents of electrons at lower temperatures than tungsten or tantalum. As discussed further below, the preferred separate mounting of the electron beam gun, thermally isolated from the ionization chamber, is an advantageous factor in keeping the ionization chamber cool. Electron beam guns having cathodes mounted close to the ionization chamber on a cooled support, which discharge directly into the chamber, are shown in the first two embodiments described below.

The electron beam, however produced, has a significant cross-sectional area, i.e. it is a broad generally collimated beam as it transits the ionization chamber, to the beam dump with which it is aligned. In preferred embodiments, the electron beam within the ionization chamber has a generally rectangular cross section, e.g. in one embodiment approximately 13 mm $\times$ 6 mm as injected into the ionization chamber, to match with a relatively wide extraction aperture of a high current machine, or the rectangular cross section is e.g. of a square cross-section profile for use with a narrower ion extraction aperture. In the case of direct injection, the shape of the injected electron beam can be determined by the shape of the electron optics, e.g. the grid and anode apertures of an electron gun, which, for example, may both be approximately 13 mm.times.6 mm, and also by the shape of the cathode or electron emitter, which, for the first example given, is somewhat larger than the grid and anode apertures, approximately 15 mm.times.9 mm. The advantage of generating a generally rectangular electron beam profile is to match the conventionally desired ion beam profile as extracted from the ion source, which is also rectangular: The rectangular exit aperture from which the ion beam is extracted is approximately 50 mm tall by 3.5 mm wide in many high-current implanters; in such cases the electron beam (and thus the ions produced by electron impact) can present a profile to the exit aperture within the ionization chamber of approximately 64 mm.times.13 mm. If the end-user wishes, an enlarged exit aperture may be employed to obtain higher extracted currents.

As mentioned above, in the walls of the ionization chamber, there are both an electron entrance port and an aligned electron exit port for the electron beam, which departs from the conventionally employed Bernas ion source. In Bernas ion sources. energetic electrons produced by an emitter located typically internal to the ionization chamber strike the walls of the chamber to form the basis of an "arc discharge". This provides a substantial heat load which elevates the temperature of the ionization chamber walls. In the present invention, the ionizing electrons (i.e the energetic or "primary" electrons) pass through the ionization chamber to the defined beam dump, substantially without intercepting the general chamber walls. "Secondary" electrons, i.e. low-energy electrons produced by ionization of the feed gas, still can reach the general walls of the ionization chamber but since these are low energy electrons, they do not provide significant heat load to the walls. The feature of through-transit of the primary electrons allows the ionization chamber to be conductively cooled, e.g. by the vaporizer, or by a cooled block against which the ionization chamber is mounted in substantial thermal contact, without providing a large heat load on the temperature controller of the vaporizer or block. To avoid the heat generated by the electron gun and the energetic electron beam, the electron gun and the electron beam dump are mounted in thermally isolated fashion, preferably either or both being mounted on respective water-cooled parts of a cooled mounting frame. This frame is dynamically cooled, e.g. by high-resistivity, de-ionized water commonly available in commercial ion implanters.

Electron Repeller

To maximize the source ionization efficiency, anti cathodes may be disposed at the opposite end of the ionization chamber from the electron emitter. The anti cathode typically operates at the same potential as the emitter, thus reflecting the electron beam back and forcing multiple passes of electrons through the ionization chamber. Alternatively, a magnetic reflector can be used. When charged particles travel towards a volume of increasing magnetic flux density, a condition exists where most of the electrons are reflected back into the direction where they came from. This effect is called magnetic mirror effect and is well characterized phenomena in plasma physics. To use this idea instead of an electrostatic anti cathode, a permanent magnet can be place at the opposite side of the ionization chamber from the emitter. This creates a strong magnetic field towards the end of the ionization chamber thus reflecting most of the ionizing electrons back towards the emitter end of the chamber. The magnetic repeller has the advantage of being in the same potential as it's surroundings, thus making it more reliable as an electrostatic anti cathode.

Cooled Mounting Frame and Beam Dump

The cooled mounting frame is e.g. a water-cooled sheet metal assembly on which the electron gun and an electron beam dump may be mounted. The beam dump may be used alternatively to the electron repeller. The frame consists of two separate mechanical parts which allow the electron gun and a beam dump to be independently biased. By mounting these two components to this frame, a heat load to the ionization chamber can be substantially avoided. The frame provides a mechanical framework for the thus-mounted components, and in addition the frame and the mounted components can be held at an electric potential different from the potential of the ionization chamber and vaporizer by mounting to the ion source assembly on electrically insulating standoffs.

In embodiments discussed below, the beam dump is discretely defined and isolated, preferably being removed from direct contact with the ionization chamber, with the electron beam passing through an exit port in the ionization chamber prior to being intercepted by the beam dump. The beam dump can readily be maintained at a potential more positive than the walls of the chamber to retain any secondary electrons released upon impact of primary electrons up on the beam dump. Also, the beam dump current can be detected for use in the control system as well as for diagnostics. Also, in a multi-mode ion source, by being electrically isolated, the voltage on the dump structure can be selectively changed to negative to serve an electron-repeller (anticathode) function, as described below.

In another construction, the distinctly defined beam dump though can be in physical contact with the exit port in such a way that thermal conduction between the cooled beam dump and the exit port is poor e.g., by point contact of discrete elements. Electrical insulation, which has thermal insulation properties as well, can be provided to enable a voltage differential to be maintained while preventing heating of the general walls of the ionization chamber. One advantage of this embodiment is a reduced conduction of the source gas out of the ionization chamber, reducing gas usage.

The extraction of ions from the ionization chamber is facilitated by an asymmetric relationship of the electron beam axis relative to the central chamber axis, locating the site of ionization closer to the extraction aperture. By maintaining a voltage on the aperture plate through which the ions are extracted that is lower than that of the other chamber walls, the ions are drawn toward the extraction path.

In use of the ion source in a mode different from that used for decaborane as described above, e.g. using $BF_3$ feed gas, the electron beam dump may be biased to a negative potential relative to the ionization chamber, e.g. to a voltage approximating that of the cathode potential, in a "reflex geometry" whereby the primary electrons emitted by the electron gun are reflected back into the ionization chamber and to the cathode, and back again repeatedly, i.e. instead of serving as a beam dump, in this mode the dump structure serves as a "repeller", or anticathode. An axial magnetic field may also be established along the direction of the electron beam by a pair of magnet coils external to the ion source, to provide confinement of the primary electron beam as it is reflected back and forth between the cathode and beam dump. This feature also provides some confinement for the ions, which may increase the efficiency of creating certain desired ion products, for example $B^+$ from $BF_3$ feed gas. Such a reflex mode of operation is known per se by those practiced in the art, but is achieved here in a unique multimode ion source design capable of efficiently producing e.g. decaborane ions.

A multimode ion source includes an electron gun for the purposes as described, disposed coaxially within a magnet coil that is associated with the source housing and ionization chamber contained within.

Figure 3:
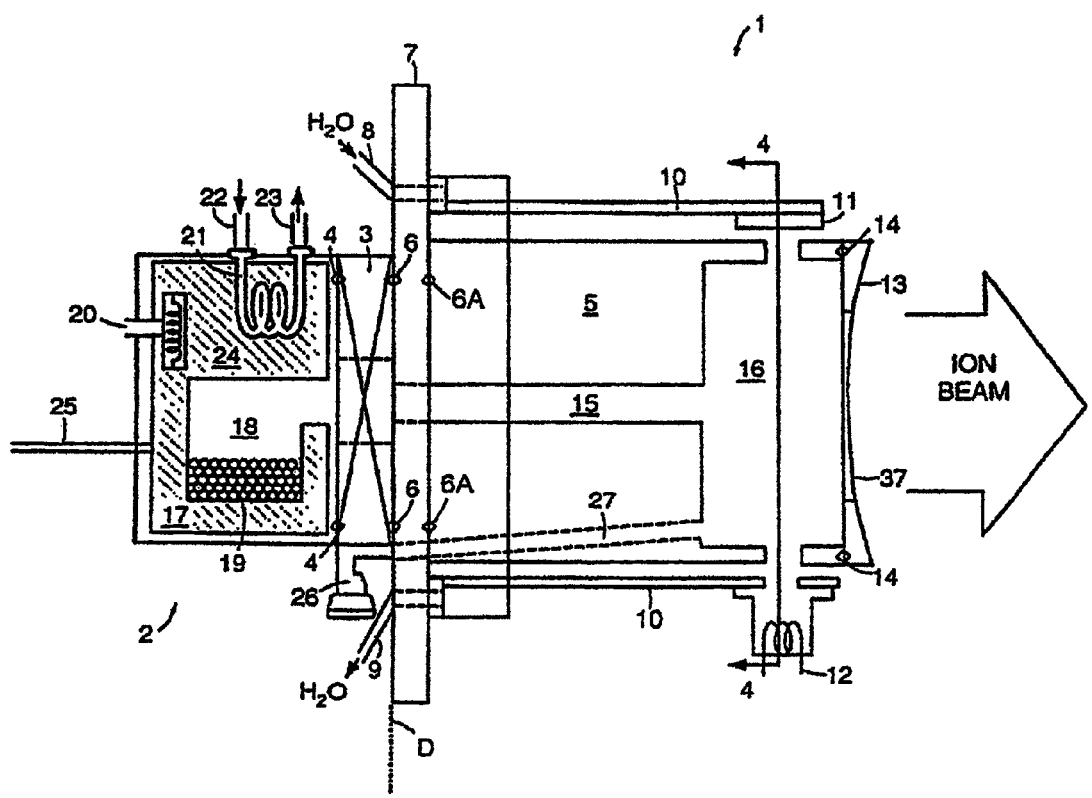
FIG. 3 is a longitudinal cross-sectional view of an embodiment of the ion source of the present invention with associated vaporizer.

FIG. 3 shows in schematic an embodiment of ion source 1. The vaporizer 2 is attached to the vaporizer valve 3 through an annular thermally conductive gasket 4. The vaporizer valve 3 is likewise attached to the mounting flange 7, and the mounting flange 7 is attached to ionization chamber body 5 by further annular thermally conductive gaskets 6 and 6A. This ensures good thermal conduction between the vaporizer, vaporizer valve, and ionization chamber body 5 through intimate contact via thermally conductive elements. The mounting flange 7 attached to the ionization chamber 5, e.g., allows mounting of the ion source 1 to the vacuum housing of an ion implanter, (see FIG. 8) and contains electrical feedthroughs (not shown) to power the ion source, and water-cooling feedthroughs 8, 9 for cooling. In this preferred embodiment, water feedthroughs 8, 9 circulate water through the cooled mounting frame 10 to cool the mounting frame 10 which in turn cools the attached components, the electron beam dump 11 and electron gun 12. The exit aperture plate 13 is mounted to the face of the ionization chamber body 5 by metal screws (not shown). Thermal conduction of the ion exit aperture plate 13 to the ionization chamber body 5 is aided by conductive annular seal 14 of metal or a thermally conductive polymer.

When the vaporizer valve 3 is in the open position, vaporized gases from the vaporizer 2 can flow through the vaporizer valve 3 to inlet channel 15 into the open volume of the ionization chamber 16. These gases are ionized by interaction with the electron beam transported from the electron gun 12 to the electron beam dump 11. The ions produced in the open volume can then exit the ion source from the exit aperture 37, where they are collected and transported by the ion optics of the ion implanter.

The body of vaporizer 2 is made of machined aluminum, and houses a water bath 17 which surrounds a crucible 18 containing a solid feed material such as decaborane 19. The water bath 17 is heated by a resistive heater plate 20 and cooled by a heat exchanger coil 21 to keep the water bath at the desired temperature. The heat exchanger coil 21 is cooled by de-ionized water provided by water inlet 22 and water outlet 23. The temperature difference between the heating and cooling elements provides convective mixing of the water, and a magnetic paddle stirrer 24 continuously stirs the water bath 17 while the vaporizer is in operation. A thermocouple 25 continually monitors the temperature of the crucible 18 to provide temperature readback for a PID vaporizer temperature controller (not shown). The ionization chamber body 5 is made of aluminum, graphite, silicon carbide, or molybdenum, and operates near the temperature of the vaporizer 2 through thermal conduction. In addition to low-temperature vaporized solids, the ion source can receive gases through gas feed 26, which feeds directly into the open volume of the ionization chamber 16 by an inlet channel 27. Feed gases provided through channel 27 for the ion implantation of semiconductors include $AsH_3$, $PH_3$, $SbF_5$, $BF_3$, $CO_2$, Ar, $N_2$, $SiF_4$, and $GeF_4$, and with important advantages $GeH_4$, $SiH_4$, and $B_2H_6$, described below. When the gas feed 26 is used to input feed gases, the vaporizer valve 3 is closed. In the case of a number of these gases, the broad beam electron ionization of the present invention produces a mid-to-low ion current, useful for mid-to-low dose implantations. For higher doses, an embodiment capable of switching mode to a reflex geometry, with magnetic field, can be employed.

Figure 3A:
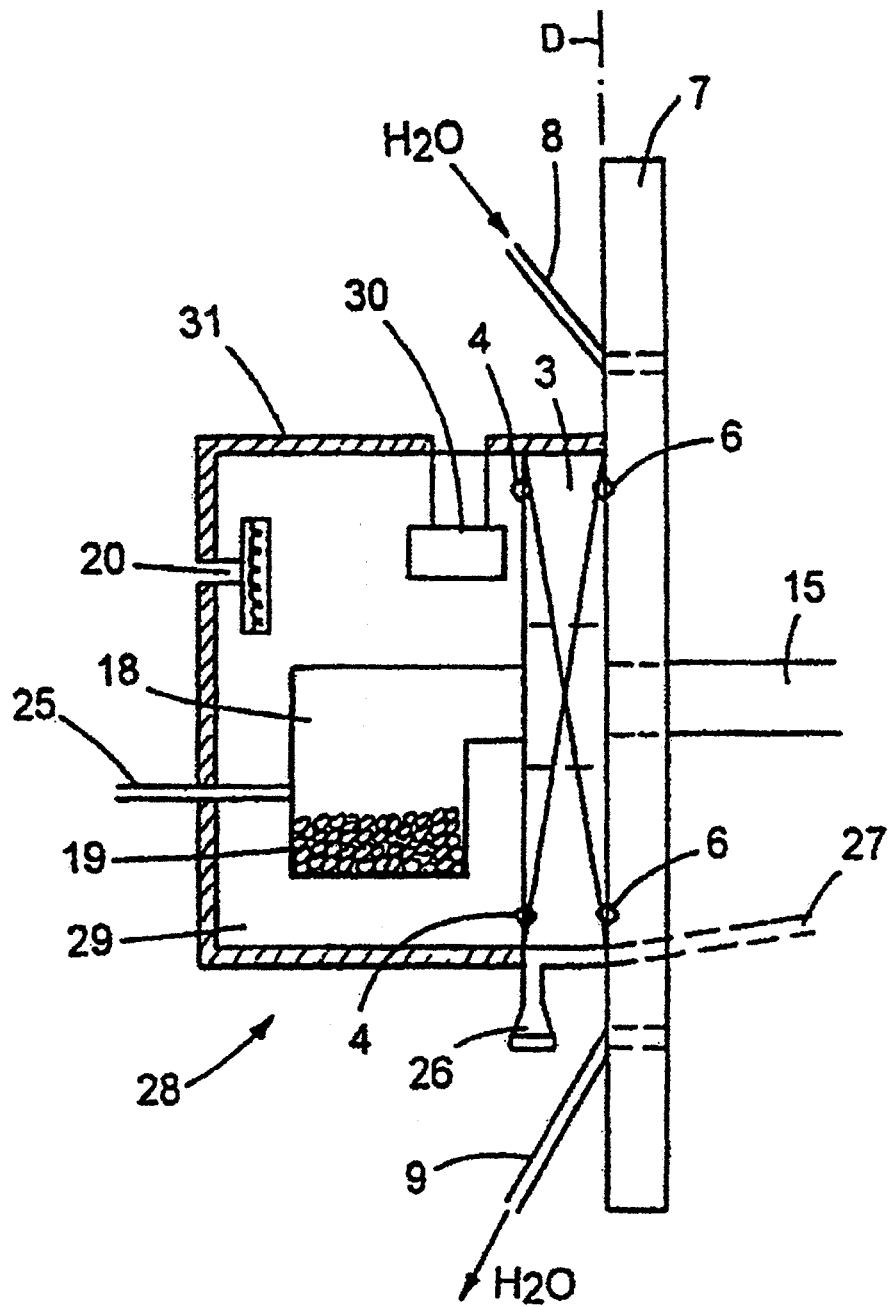
FIG. 3A is a cross-sectional view, similar to a part of FIG. 3, showing another embodiment of a vaporizer.
Figure 3B:
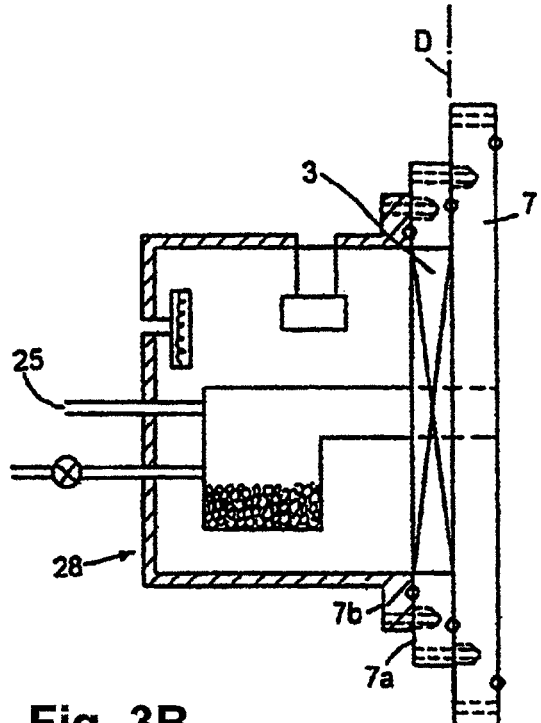
Figure 3C:
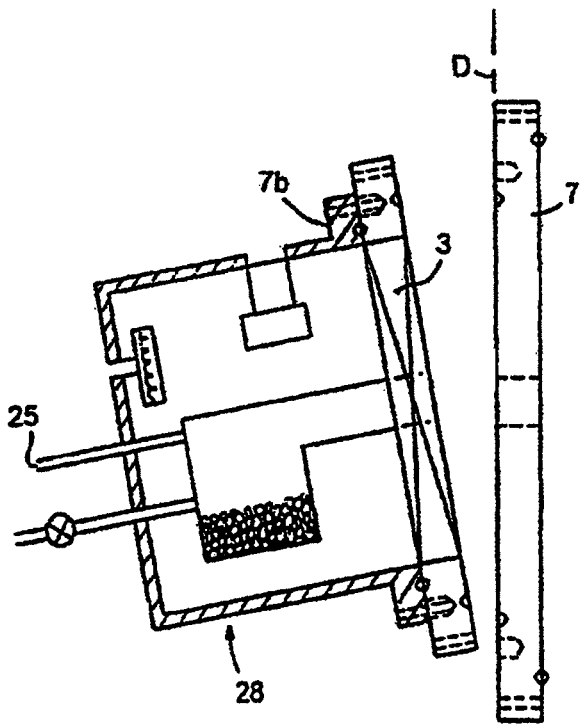
FIG. 3C illustrates detaching the vaporizer and valve from the ion source.

The vaporizer 2 of FIG. 3, or that of FIG. 3A to be described, can be demounted from the ion source 1 by closing the vaporizer valve 3 and removing the unit at seal 6, (parting line D), compare FIGS. 3B and 3C. This is useful for recharging the solid feed material in the crucible 18, and for maintenance activities.

Figure 3D:
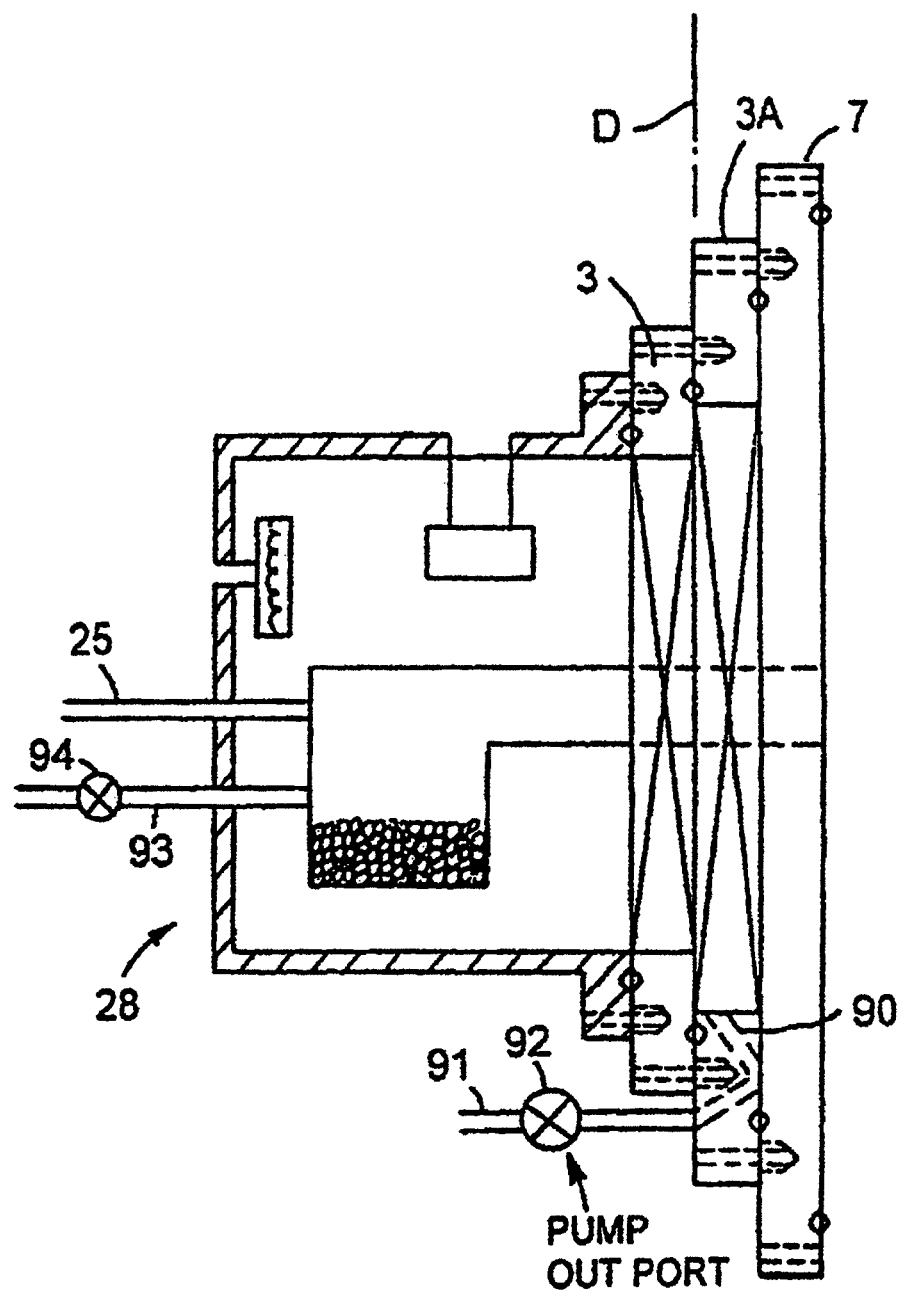
FIG. 3D illustrates a two-valve embodiment in which separation of the vaporizer from the ion source can occur between the two valves.

In the embodiment of FIG. 3D, two valves, 3 and 3A are provided in series, valve 3 being permanently associated, as before, with removable vaporizer 28 and valve 3A being permanently associated with mounting flange 7, with the demounting plane D disposed between the two valves.

In the embodiment of the ion source shown in FIG. 3A, the vaporizer 28 is of a different design from that of FIG. 3, while the rest of the ion source is the same as in FIG. 3. In vaporizer 28, there is no water bath or water-fed heat exchanger. Instead, the volume occupied by water bath 17 in FIG. 3 is occupied by the machined aluminum body 29 of vaporizer 28. A resistive heater plate 20 is in direct thermal contact with the vaporizer body 29 to conductively heat the body 29, and a thermoelectric (TE) cooler 30 is in direct thermal contact with the vaporizer body 29 to provide conductive cooling. A thermally insulating sleeve 31 surrounds the vaporizer 28 to thermally insulate the vaporizer from ambient temperature. If desired, several heater plates 20 and TE coolers 30 can be distributed within the vaporizer body 29 to provide more conductive heating and cooling power, and also to provide a more spatially uniform temperature to the crucible. This construction permits the vaporizer to operate at temperatures in excess of 100 C, up to about 200 C.

FIG. 3B illustrates an embodiment in which successive mounting flanges of the series of vaporizer 28, isolation valve 3 and the ion source 1, are of increasing size, enabling access to each flange for detachment. Mounting flange 70 enables bolt-on of the assembled ion source to the ion source housing, see e.g. FIG. 8. Mounting Flange 7a enables attachment and detachment of the vaporizer 28 and its associated valve 3 from flange 7 at parting line D, see FIG. 3C. Mounting Flange 7b enables detachment of the valve 3 from the main body of the vaporizer for maintenance or recharging the vaporizer.

The embodiment of FIG. 3D has two valves 3 and 3a, valve 3 normally staying attached to the vaporizer and valve 3a normally attached to ion source mounting flange 7. These enable isolation of both the vaporizer 28 and the ion source 1 before demounting the vaporizer at parting line D. The body of mated valve 3a includes roughing passage 90 connected by valve 92 to roughing conduit 91 by which the space between the valves may be evacuated, and, upon opening valve 3, by which the vaporizer may be evacuated prior to opening valve 3a. Thus attachment of vaporizer 28 need not adversely affect the vacuum being maintained in the ion source and beam line.

The vent line 93, and associated valve 94 enables relief of vacuum within the vaporizer prior to performing maintenance and as well may be used to evacuate and outgas the vaporizer after recharging, to condition it for use.

Figure 3E:
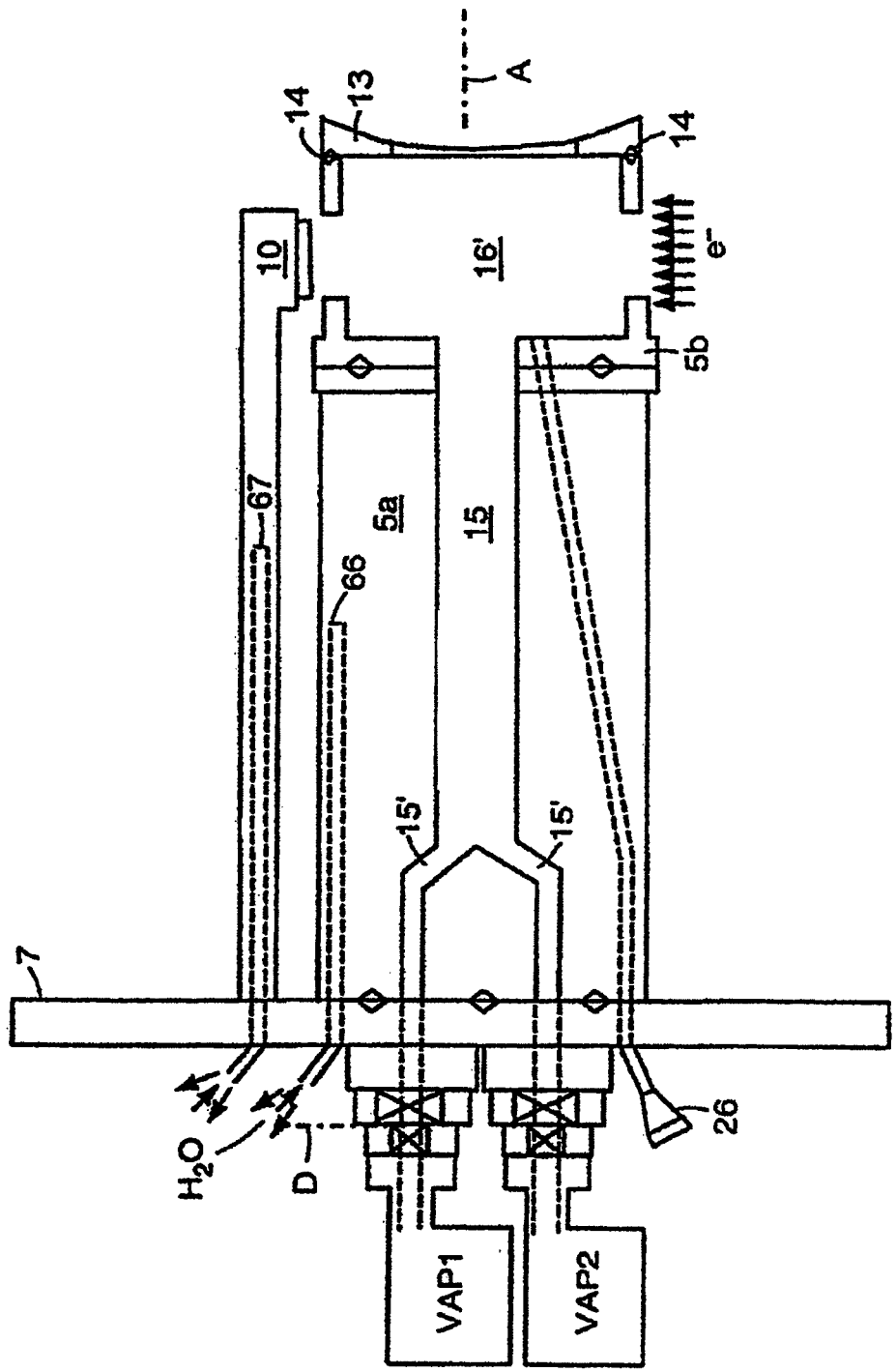
FIG. 3E illustrates a dual vaporizer embodiment.

The embodiment of FIG. 3E illustrates a dual vaporizer construction, having the capabilities previously described. The vapor passage 15 in metal block heat sink 5a bifurcates near mounting flange 7, the branches 15' leading to respective demountable vaporizers VAP1 and VAP2, each having two isolation valves separable at parting line D. The ionization chamber body 5b is of discrete construction, demountably mounted in intimate heat transfer relationship to temperature controlled mounting block 5a.

Separate coolant passage 66 and 67 telescopically receive so-called squirt tubes which centrally conduct cold, deionized water to the dead end of the passage. The emerging cooled water has its maximum effect that that point, in the outward regions of respectively the mounting block 5a and the cooled frame 10, the water returns through the annular space defined between the exterior of the squirt tube and the passage in which the tube resides.

Figure 3F:
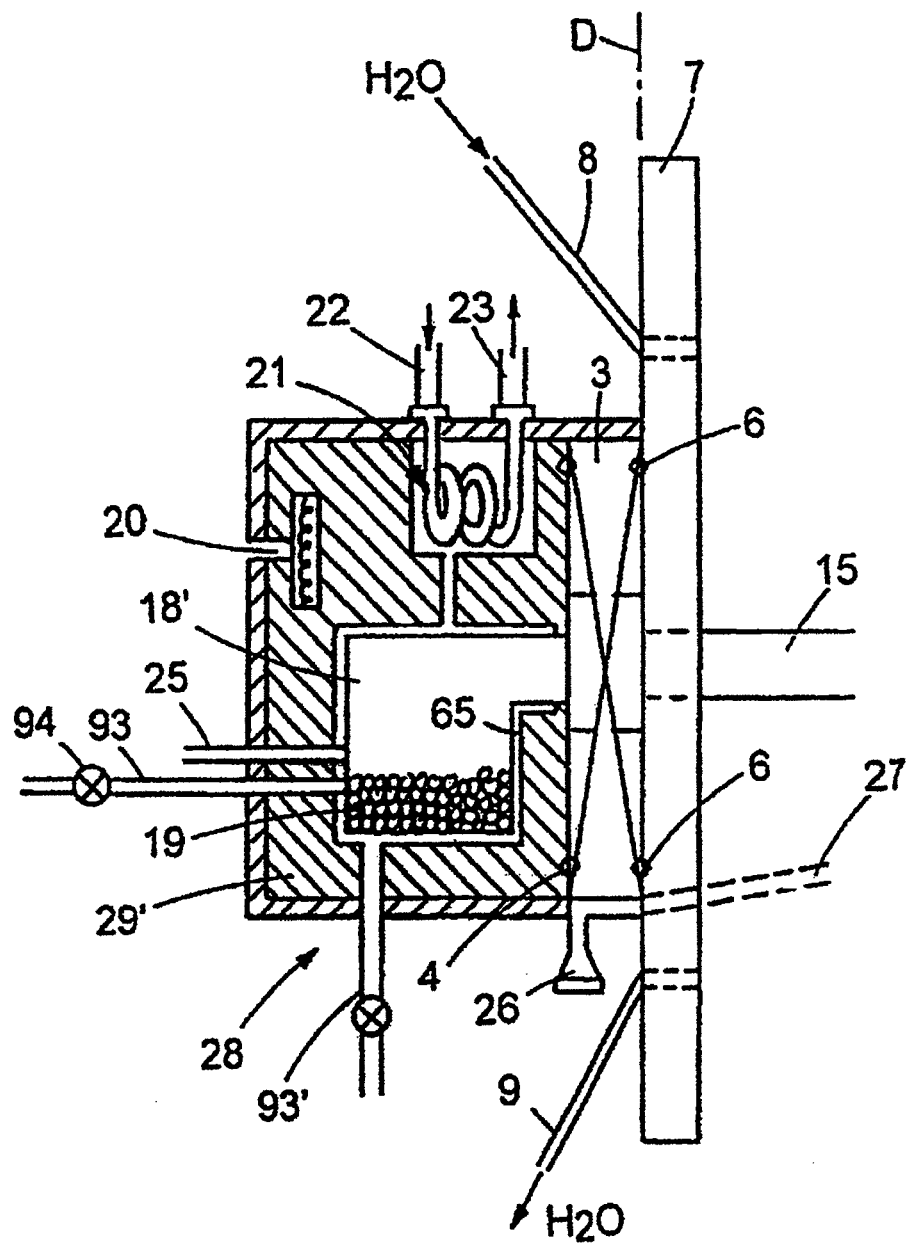
FIG. 3F shows another embodiment of a vaporizer similar to FIG. 3A, but with a separate crucible and with gas-mediated conduction between vaporizer housing and crucible, and between a heat exchanger and the housing.

FIG. 3F shows a vaporizer similar to that of FIG. 3A, but instead of a one-piece aluminum construction, the body of the vaporizer has two mating, but separate components: a vaporizer housing 29.sup.1 and a crucible 18.sup.1. The crucible is inserted into the housing 29.sup.1 with a close mechanical fit. The surface of the vaporizer housing which makes contact with the crucible contains a pattern of rectangular grooves, into which pressurized gas (typically at sub-atmospheric pressure) is introduced through gas inlet 93.sup.1. The pressurized gas provides sufficient thermal conductivity between the crucible 18.sup.1 and the temperature-controlled housing 291 to control the temperature of the crucible surface 65 in contact with decaborane or other solid feed material 19 to be vaporized. This embodiment allows the crucible 181 to be easily replaced during service of the vaporizer. Gas is also fed into the volume surrounding heat exchanger 21, to promote thermal conduction between the heat exchanger 21 and the housing 29.sup.1. The heat exchanger 21 is shown as a water-fed coil, but may alternatively comprise a TE cooler, such as cooler 30 in FIG. 3A.

Figure 4:
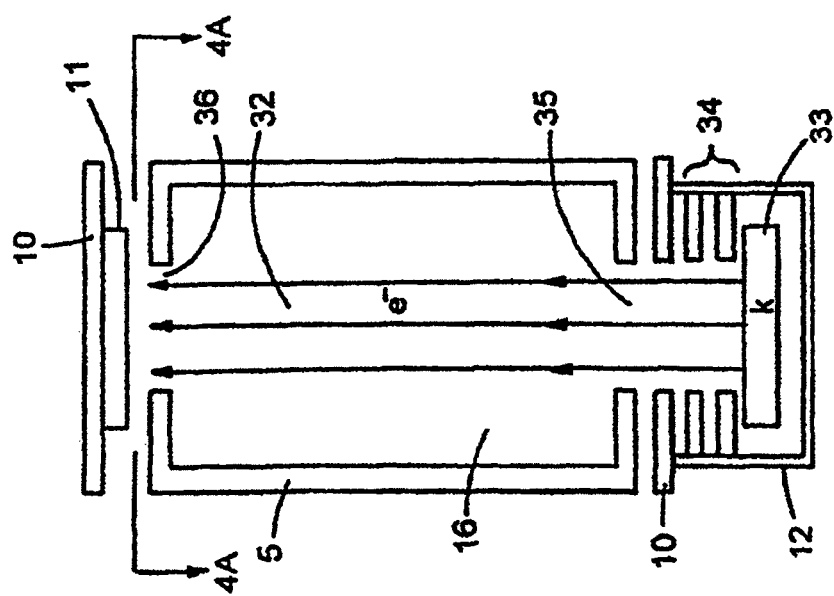
Figure 4B:
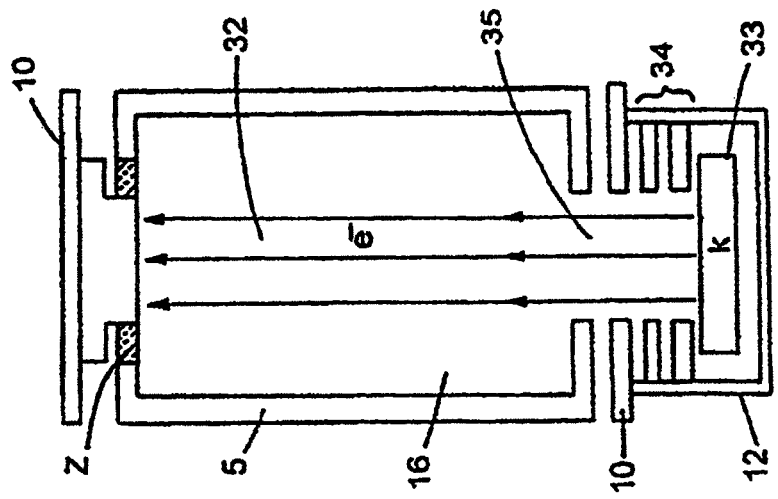
FIGS. 4B and 4C are views similar to that of FIG. 4, of other arrangements of the discretely defined electric beam dump.
Figure 5:
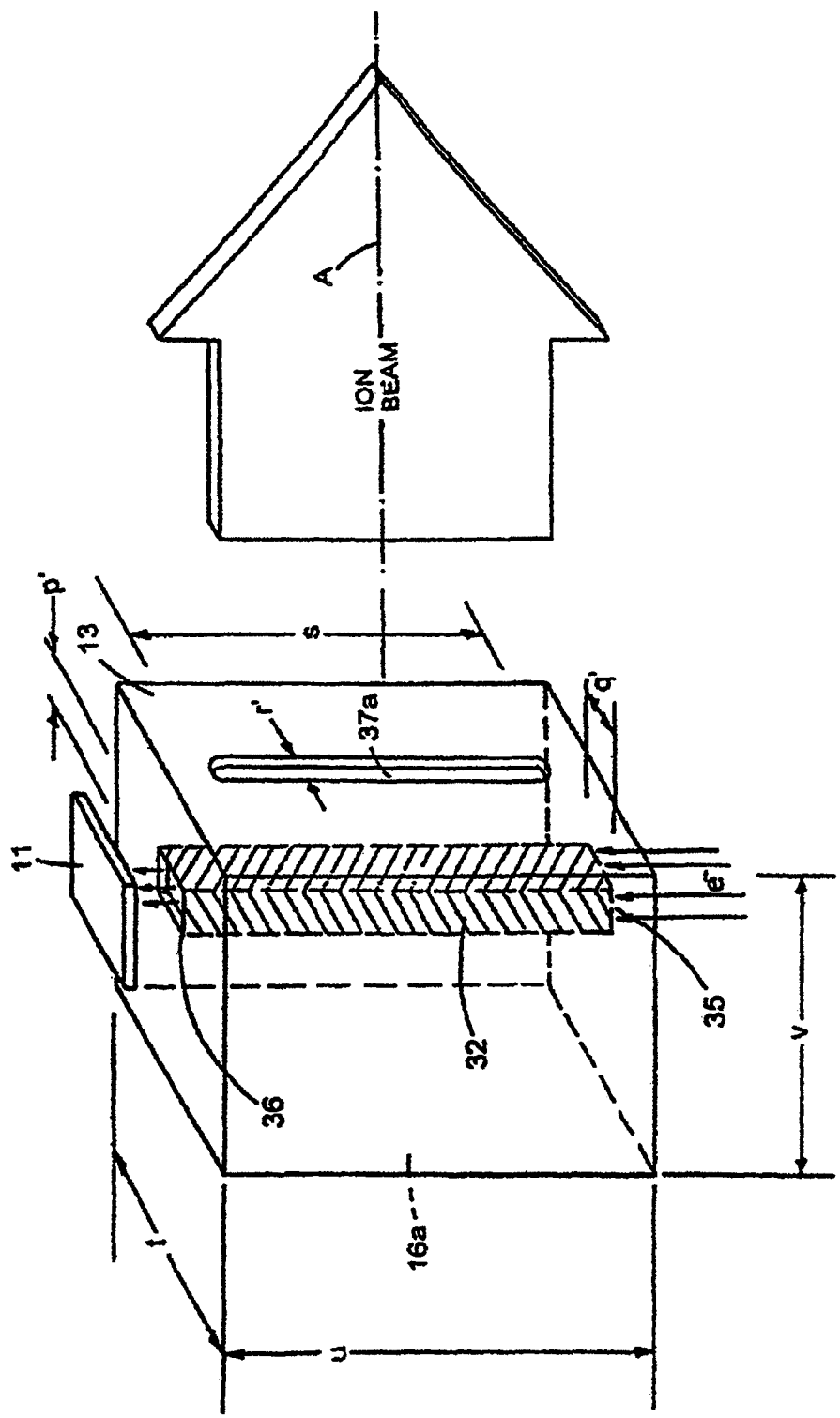
FIG. 5 is a view similar to FIG. 4F of the relationship of a broad electron beam and ion extraction aperture of narrower dimension.
Figure 6:
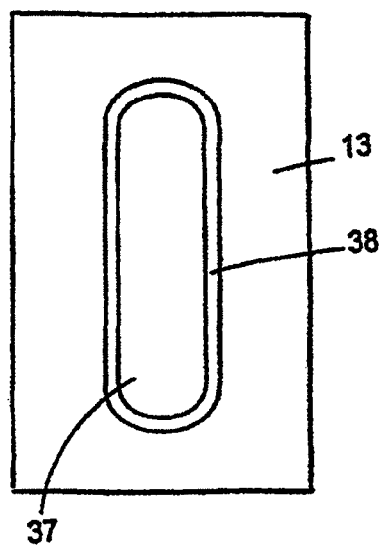
FIG. 6 is a front view of the aperture plate of the ion source of FIG. 3.

The electron beam passes through a rectangular entrance port 35 (FIG. 4) in the ionization chamber and interacts with the neutral gas within the open volume 16, defined within the ionization chamber body 5. The beam then passes directly through a rectangular exit port 36 in the ionization chamber and is intercepted by the beam dump 11, which is mounted on the water-cooled mounting frame 10. Beam dump 11 is maintained at a positive potential relative to the electron gun, and preferably slightly positive relative to the walls of the ionization chamber as well. Since the heat load generated by the hot cathode 33 and the heat load generated by impact of the electron beam 32 with the beam dump 11 is substantial, their location outside of the ionization chamber open volume 16 prevents their causing dissociation of the neutral gas molecules and ions. The only heat load from these elements to the ionization chamber is limited to modest radiation, so the ionization chamber can be effectively cooled by thermal conduction to the vaporizer 2 (FIG. 3) or by conduction to a massive mounting block 5a (FIG. 3E). Thus, the general walls of the ionization chamber can be reliably maintained at a temperature below the dissociation temperature of the neutral gas molecules and ions. For decaborane, this dissociation temperature is about 350 C. Since the ion exit aperture 37 in plate 13, shown in FIGS. 4B, 5 and 6, is a generally rectangular aperture, the distribution of ions created adjacent to the aperture by the broad, collimated beam of generally uniformly dispersed electrons should be likewise uniform. In the ionization of decaborane and other large molecules, according to this embodiment, an arc plasma is not sustained, but rather the gas is ionized by direct electron-impact ionization by the primary (energetic) electrons, in the absence of containment by any major confining magnetic field. The absence of such magnetic field limits the charge-exchange interactions between the ions and relatively cool secondary electrons as they are not strongly confined as they are in an arc plasma (confined secondary electrons can cause loss of the ions of interest through multiple ionizations). The decaborane ions are generated in the widely distributed electron beam path. This reduces the local ion density relative to other conventional ion sources known in the art.

The absence of magnetic field can improve the emittance of the extracted ion beam, particularly at low (e.g., 5 keV) extraction energy. The absence of an arc plasma as in a Bernas source also can improve emittance since there is no plasma potential present in the ionization and extraction region. (I recognize that the presence of an arc plasma potential in conventional plasma-based ion sources introduces a significant random energy component to the ions prior to being extracted, which translates directly into an added angular spread in the extracted ion beam. The maximum angular spread $\theta$ due to a plasma potential $\phi$ is given by: $\theta = 2 \arcsin\{\phi/E\}^{1/2}$, where E is the beam energy. For example, for a plasma potential of 5 eV and a beam energy of 5 keV, $\theta = 2.5$ deg. In contrast, the random energy of ions produced by direct electron-impact ionization is generally thermal, much less than 1 eV.)

Figure 4A:
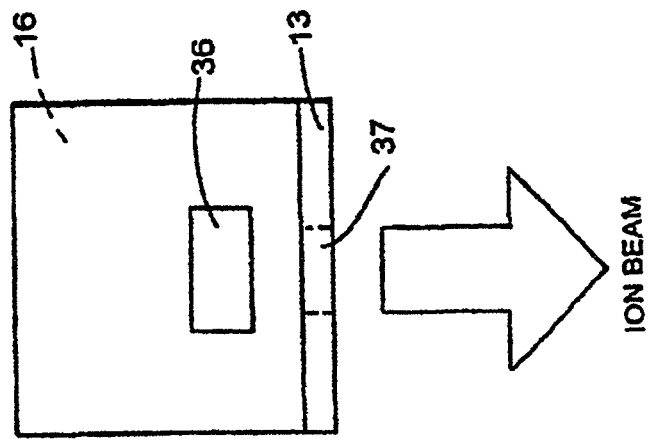
FIG. 4A is a top view taken on line 4A-4A of FIG. 4, illustrating a known electron emitter which includes a corresponding anode and electron optics.
Figure 4C:
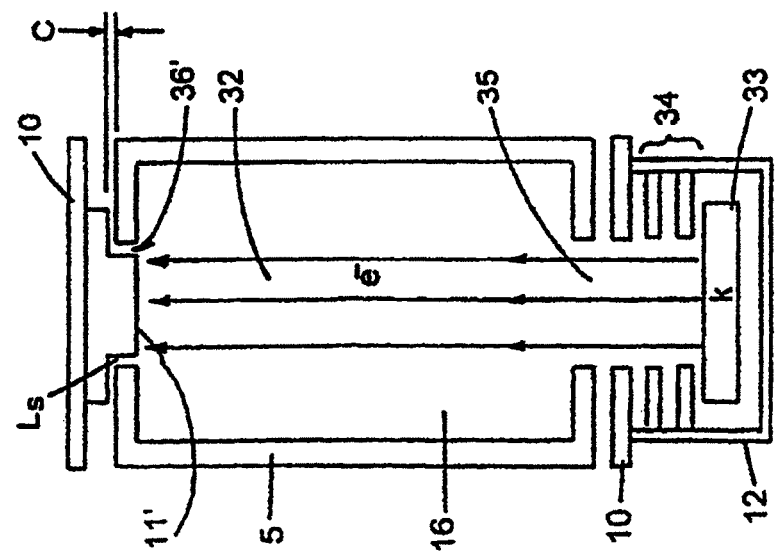

FIG. 4A shows a top view of the electron exit port 36 in the open volume 16 of ionization chamber body 5, and its proximity to the ion exit aperture 37 in aperture plate 13. To enable the ions to be removed from the ionization chamber by penetration of an electrostatic extraction field outside of the ion source 1 through the ion exit aperture 37, the electron beam 32 and electron exit port 36 are situated close to the exit aperture plate 13 and its aperture 37. For example, a separation of between 6 mm and 9 mm between the edge of the ionization region and the ion extraction aperture can result in good ion extraction efficiency, the efficiency improving with larger width extraction apertures. Depending upon the particular parameters chosen, the broad, collimated electron beam 32 may not fully retain its rectangular profile due to scattering, and also due to space charge forces within the electron beam 32. The electron exit port 36 is sized appropriately in accordance with such design choices to allow passage of the electron beam without significant interception by the general walls of the ionization chamber body 5. Thus, in certain advantageous instances, port 36 is larger than port 35 so that it is aligned to receive and pass at least most of the residual electron beam.

The embodiment of FIG. 4B illustrates a discretely defined beam dump 11' which is sized and shaped to fit within port 36' such that its inner, electron receiving surface lies flush with the inner surface of the surrounding end wall of the chamber body 5. Beam dump 11' is mounted upon and is cooled by cooled frame 10, as before. As shows, a clearance space c, e.g., of 1 mm, is maintained betaeen the beam dump structure and the wall of the chamber. Preferably, as shown, the structures are cooperatively shaped as in a labyrinth L.sub.s to limit the outflow of the dopant gas or vapor, while maintaining thermal and electrical isolation of the dump structure 11' from the walls of the ionization chamber, maintaining electrical isolation of the beam dump 11' while preventing loss of dopant gas or vapor.

In the embodiment of FIG. 4C electrical insulation Z fills the space between the beam dump and the wall of the ionization chamber, maintaining electrical isolation of the beam dump 11' while preventing loss of dopant gas or vapor.

Referring to FIGS. 4D and 4E, a thermoelectrically or water-cooled outer housing H.sub.c defines a space into which a chamber-defining member 5c of heat-conductive and electrically-conductive material is removably inserted with close operational fit. Gas inlets G.sub.i introduce conductive gas of a subatmospheric pressure (e.g., between 0.5 and 5 Torr), that is significantly higher than that of the operational vacuum V.sub.o within the overall ion source housing 49 which contains the ionization chamber assembly. The conductive gas (for example, N.sub.2, Ar, or He) is introduced to the interface I.sub.f between matching surfaces of the housing and the chamber in regions remote from exposure of the interface to operational vacuum V.sub.o, and isolated from the vaporizer and process gas feed lines. In a preferred embodiment, the cooling gas is fed through an aluminum block or cooled housing and exits between the demountable ionization chamber and the block or housing, at the interface between them, into cooling channels machined into the aluminum block. The cooling channels have the form of linear grooves (e.g., 1 mm wide by 0.1 mm deep) which populate a significant percentage of the surface area between the two mating components. This construction allows the flat mating surfaces (the grooved aluminum surface and the flat surface of the separate ionization chamber) of the two components to mate flush with one another. Simple elastomeric o-rings encompass the surface area which contains the cooling channel grooves, ensuring that the gas confined to the cooling channels is isolated from regions which contain feedthroughs and passages for process gas or vapor within this interface, and also isolates the cooling gas from the ionization volume and from the vacuum housing. The spacing between those surfaces and the pressure of the conductive gas in the interface are so related that the mean-free path of the conductive gas molecules is of the order of or less than the spacing of opposed surface portions at the interface.

The conductive gas molecules, by thermal motion, conduct heat across the interface from the chamber wall to the surrounding cooled housing elements. Any regions of actual physical contact between the solid material of the chamber body and of an outer housing element likewise promotes cooling by conduction. It is to be noted that the mode of conductive gas cooling described here does not depend upon convectional gas flow, but only upon the presence in the interface of the gas molecules. Therefore, in some embodiments, it may be preferred to form seals at the interface to capture the gas, as discussed above, although in other embodiments exposure of the interface at edges of the assembly with leakage to the operational vacuum V.sub.o can be tolerated just as is the case with respect to cooling of semiconductor wafers as described, e.g., in the King U.S. Pat. No. 4,261,762.

In other embodiments, the cooling housing of the ionization chamber assembly or similar side wall elements of other structures of the ion source are water-cooled in the manner of cooling the mounting frame 10 as described herein. In some embodiments, depending upon the heat load on the ionization chamber, the heat conduction resulting from the inclusion of thermally conductive gasket seals, as well as regions of physical point contact between the matching surfaces of the chamber and housing elements is sufficient to keep the chamber within the desired temperature range, and the conductive gas-cooling feature described is not employed.

It is recognized that the heat-transfer relationships described here have general applicability throughout the ion source and the other structural components of the implanter as well. Thus, the temperature of the vaporizer may be controlled by the heat transfer from a disposable crucible to surrounding elements via gas conduction at an interface, for operating conditions which require less than, for example, 2W/cm.sup.2 of heat transfer through the gas interface. Likewise, surfaces of the electron gun, the electron beam dump, the mounting frame and the aperture plate may serve as conductors via a conductive gas interface to temperature-control elements such as the thermoelectrically or water-cooled housing that has been described, as illustrated in FIG. 4E.

Figure 4F:
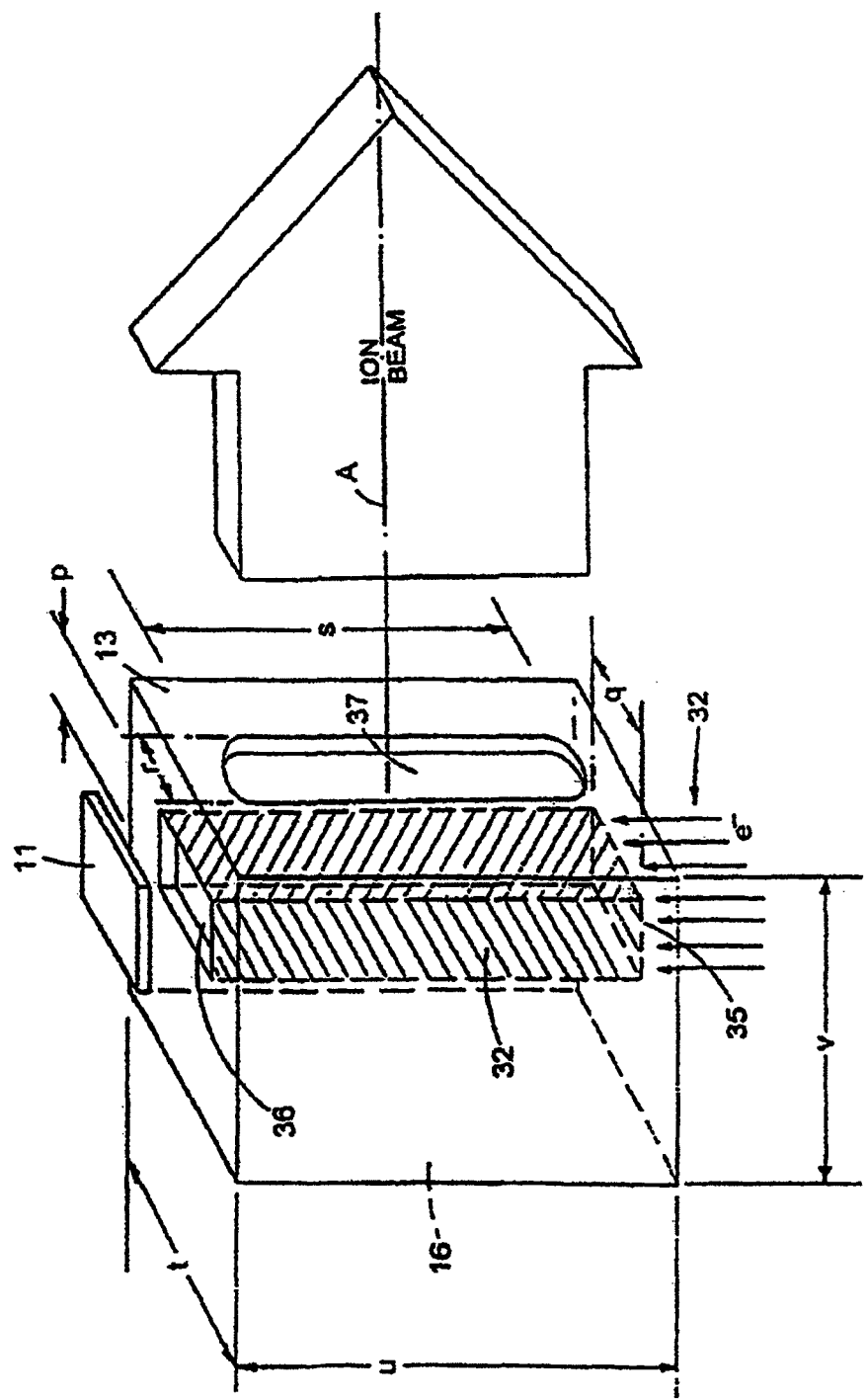
FIG. 4F is a three dimensional representation of a broad, collimated electron beam and its relation to the ion extraction aperture of the embodiment of FIGS. 3 and 4.

FIGS. 4F and 5 show different sizes of a broad, collimated electron beam passing through the ionization chamber, the profiles of these beams matched in profile to the wide and narrower apertures of the respective ionization chambers of FIGS. 4F and 5.

FIG. 6 shows the ion exit aperture plate 13 with the axis of the ion beam directed normal to the plane of the paper. The dimensions of the exit aperture plate conform to the dimensions of the ionization chamber within body 5, approximately 7.6 cm tall.times.5.1 cm wide. The exit aperture plate contains an opening 37 which is approximately 5.1 cm in height, s, by 1.3 cm wide, r, suitable for high current implanters, and has a bevel 38 to reduce strong electric fields at its edges. It is matched by a broad, collimated electron beam having width g of 19 mm and depth p of 6 mm, cross-sectional area of 114 square mm. The aperture of the embodiment of FIG. 5, has similar features but a much narrower width, e.g. a width r.sup.1, 4 mm, matched by an electron beam of width g.sup.1 6 mm and a depth p.sup.1 of 6 mm.

Figure 7:
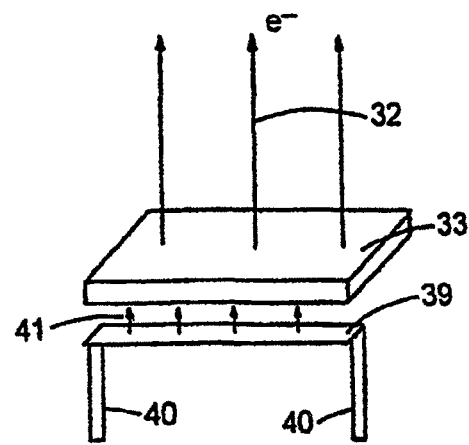
FIG. 7 is an illustration of an indirectly heated cathode arrangement.

FIG. 7 shows the shape of the cathode 33, or electron emitter. In a preferred embodiment, it defines a planar emitting surface, it's dimensions being roughly 15 mm long-.times.9 mm.times.3 mm thick. It can be directly heated by passing an electric current through it, or it can be indirectly heated, as shown, with an electric current flowing through filament 39 via leads 40, heating it to emit thermionic electrons 41. By biasing the filament 39 to a voltage several hundred volts below the potential of cathode 33, thermionic electrons 41 heat the cathode 33 by energetic electron bombardment, as is known in the art.

Figure 8:
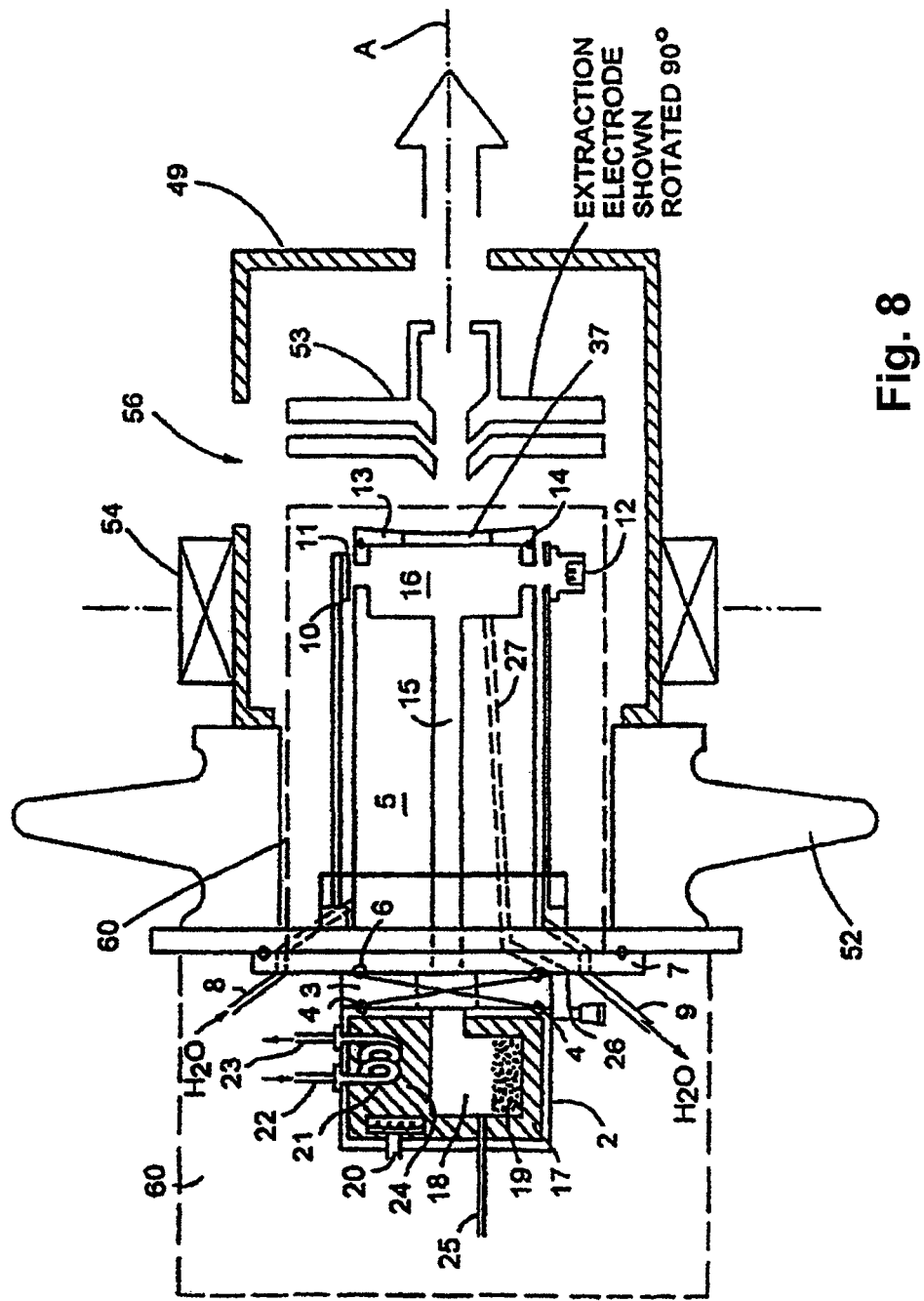
Figure 8A:
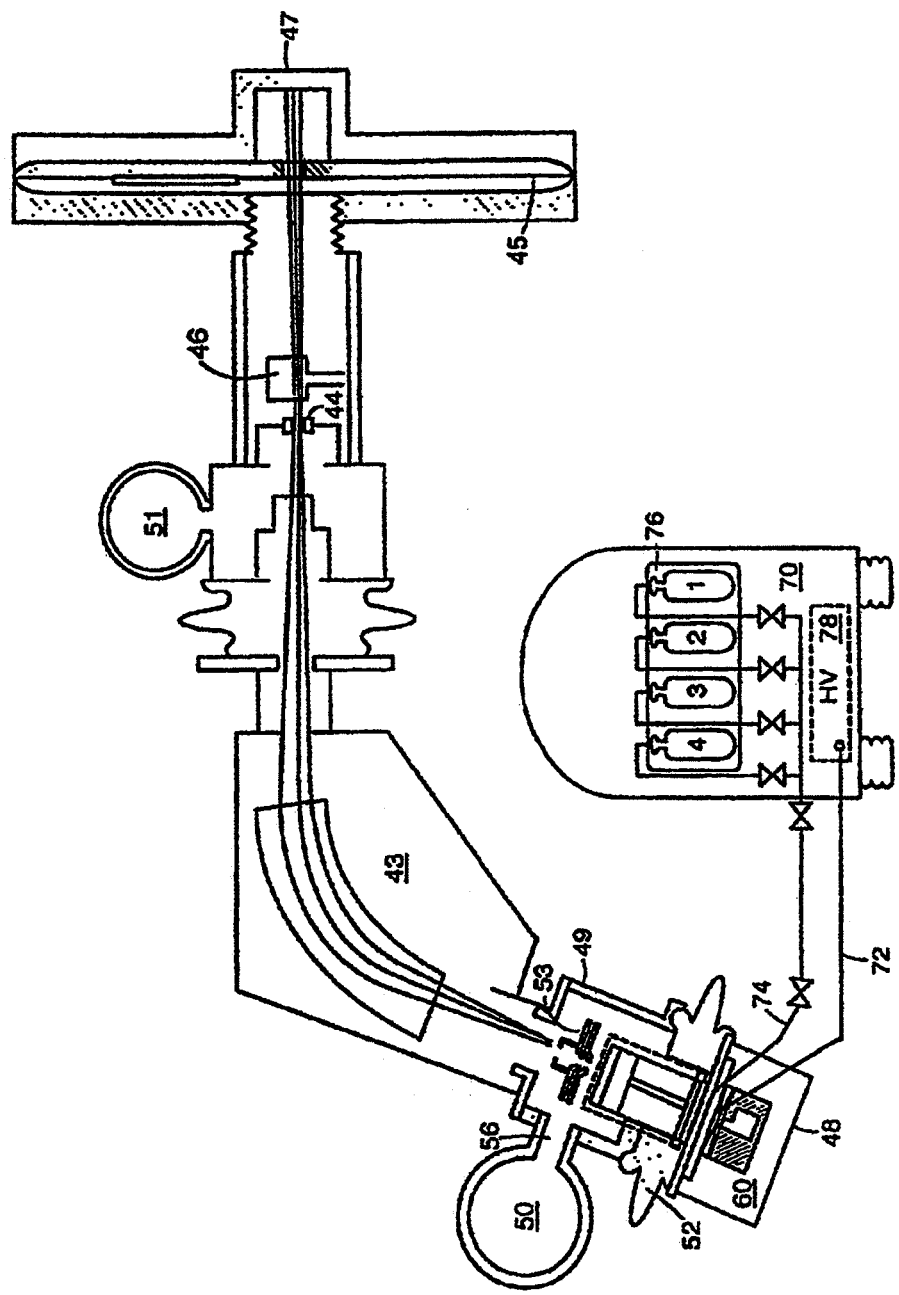
FIG. 8A illustrates, on a smaller scale, the entire implanter of FIG. 8.

FIG. 8 illustrates the assembly of an ion source according to FIG. 3A into a retrofit volume 60 of a previously installed ion implanter while FIG. 8A illustrates the complete ion implanter.

In this particular embodiment nothing has been disturbed except that the Bernas ion source for which the implanter was originally designed has been removed and, into the vacated volume 60, the ion source of FIG. 3A has been installed, with its flange 7 bolted to the ion source housing flange. The extraction electrodes 53 remain in their original position, and the new ion source presents its aperture 37 in the same region as did the arc discharge Bernas source. The magnet coils 54 are shown remaining, available e.g., for operation in reflex mode if desired, or for applying a containment field for electrons proceeding to the beam dump 11.

Water Cooled Block and Demountable Ionization Chamber

In the embodiment of FIG. 3E, the ionization volume 16' is defined by a demountable end module 5b which is mounted with conductive thermal contact on the end of solid mounting block 5a via thermally conductive seal 6".

For achieving demountability, the conductive seal 6" is compressed via metal screws through mating surfaces of the block 5a and the demountable end module 5b. This construction enables the member 5b defining the ionization chamber 16' to be removed from the block 5a and replaced with an unused member, advantageously of disposable construction. It also enables a different, and in some cases more efficient cooling of walls of the ionization chamber 16' than in previous embodiments. For construction of the demountable member, in addition to aluminum (which is inexpensive and less injurious to the wafers being implanted than molybdenum, tungsten or other metals if transported to the wafer in the ion beam), the ionization chamber member 5b and exit aperture plate 13 are advantageously constructed from graphite or SiC, which removes altogether the possibility of metals contamination of the wafer due to propagation from the ion source. In addition, demountable ionization chambers of graphite and SiC may be formed cheaply, and thus can be discarded during maintenance, being less expensive to be replaced than a one-piece structure.

In another embodiment, for conductively controlling the temperature of the block 5*a* and the chamber body 5*b*, they have mating smooth surfaces, the surface of the block containing machined cooling channels which admit conductive cooling gas between the block 5*a* and the chamber body 5*b*, so that that gas, introduced under vacuum, transfers heat by heat conduction (not convection) in accordance with the above description of FIGS. 4D and 4E, and cooling techniques used for the different situation of cooling wafers that are being implanted, see King U.S. Pat. No. 4,261,762. In this case, gaskets at the vapor and gas passages prevent mixing of the conductive heat transfer gas, such as argon, with the gas or vapor to be ionized.

As shown, block 5*a* is cooled by water passages 24*a*, either associated with its own thermal control system, FIG. 3E or associated with the cooling system 24 that cools frame 10 on which the beam dump 11 is mounted. By being based upon heat conduction through solid members, water contact with the walls of the ionization chamber is avoided, making it uniquely possible to fabricate the ionization chamber of materials, such as low cost machined or molded graphite, which cannot conveniently be exposed to water. The remote location of the cathode and its heat effects combine with these mounting features to achieve desired cool-running of the ionization chamber.

Electron Injection for High Current Applications

For some ion implant applications, it is desired to obtain an ion current approaching the highest ion currents of which the technology is capable. This depends critically on the value of electron beam current traversing the ionization chamber, since the ion current produced is roughly proportional to the value of this electron current. The electron current injected into the ionization chamber is limited by the effects of space charge forces that act on the electron trajectories within the electron gun optics and the ionization chamber. In the space charge limit, these forces can add an increased width to a tightly focused beam waist produced by a lens, and can introduce an increased angular divergence to a beam as it diverges downstream of the waist.

The maximum electron current which can be transported through a tube of diameter D and length L can be produced by focusing the beam on a point at the center of the tube with an angle a=D/L expressed in radians. In such case, the maximum current is given by: $I_{max} = 0.0385 \, V^{3/2} a^2$ (1)

where $I_{max}$ is the electron current measured in mA, and V is the voltage in volts corresponding to electrons of energy E=eV, where e is the electronic charge. Also, in this example the minimum waist diameter w is given by w=0.43 D. Inserting a=15.degree. and V=100V into equation (1) yields $I_{max}$=10 mA, whereas inserting a=5.degree. and V=100V yields $I_{max}$=106 mA.

Figure 11A:
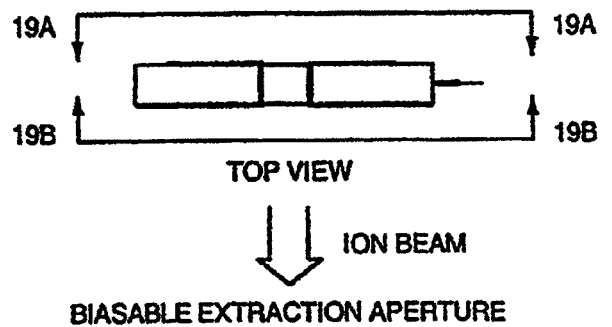
FIG. 11 is a top view of an aperture plate that has provisions for receiving a bias voltage relative to the voltage of the remaining walls of an ionization chamber, while FIGS. 11A and 11B, taken on respective lines in FIG. 11, are side views respectively of the inside face of the aperture plate, facing the interior of the ionization chamber and the outside face, directed toward the extraction optics.
FIG. 11C is an edge view of an aperture plate illustrating it's mounting to the main body of the ionization chamber by insulating stand offs.
Figure 11B:
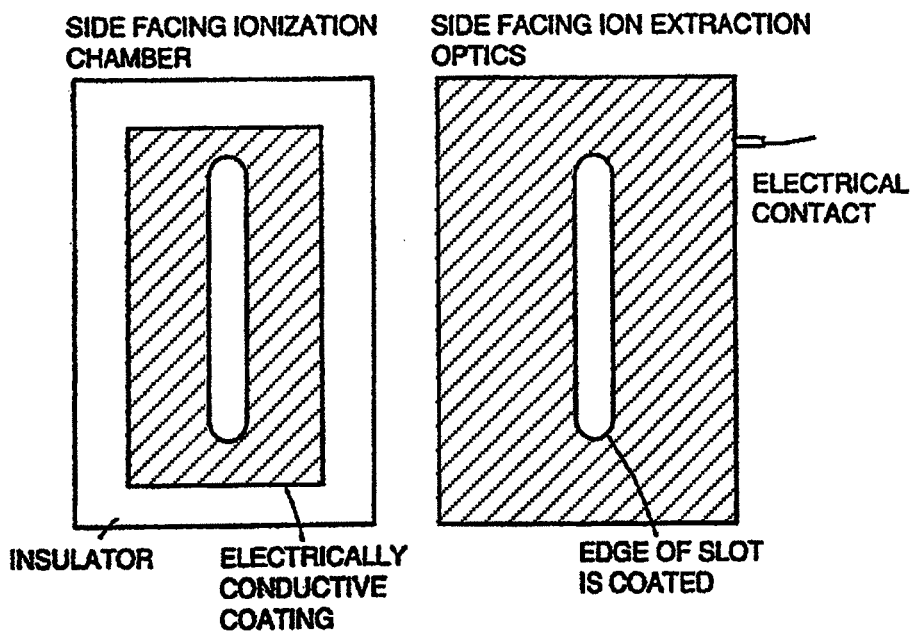

Referring to the embodiment of FIGS. 11-11B, biasing of the aperture plate is accomplished by forming it of an insulating material such as boron nitride, coating the exterior and interior surfaces which are exposed to the ions with an electrically conductive material such as graphite, and electrically biasing the conductor.

Figure 11C:
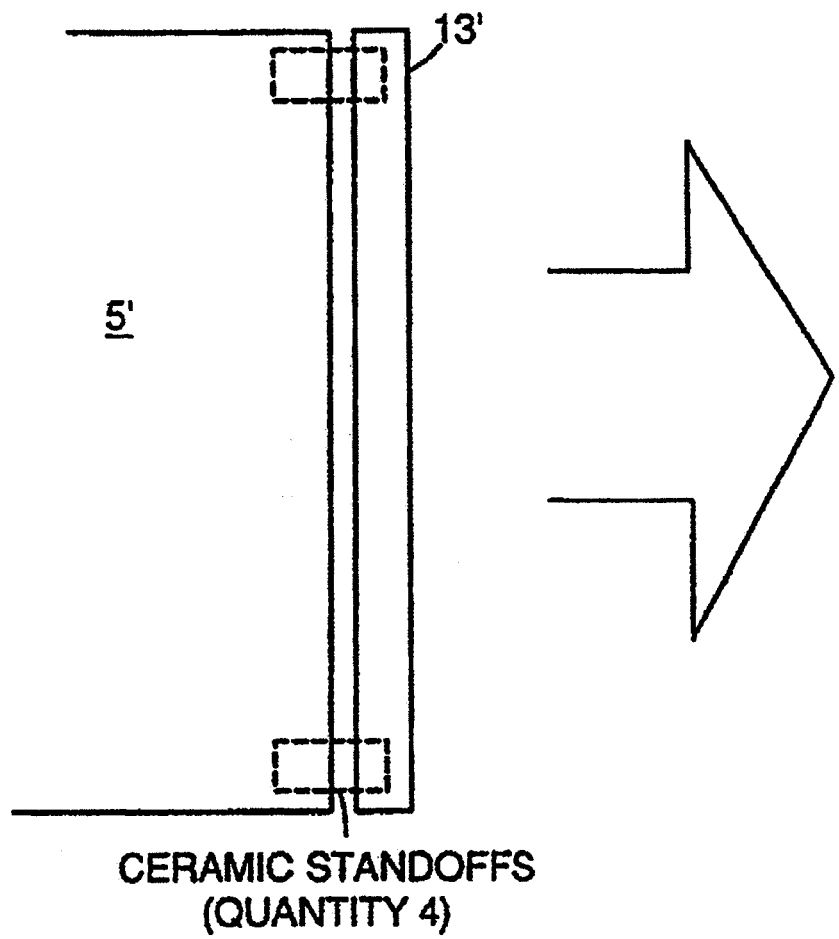

In other embodiments insulator standoffs are employed, see FIG. 11C, to join the electrically conductive extraction aperture plate to the chamber while maintaining its electrical independence. In embodiments of this feature, gas loss from the ionization chamber at the edges of the aperture plate can be minimized by interfitting conformation of the edges of the electrically isolated aperture plate and the body of the ionization chamber (involuted design) to effect labyrinth seal effects such as described in relation to FIG. 4B.

In accordance with the embodiment of FIGS. 12A, B and C, an electrically conductive aperture plate insert is mounted in an electrically insulating frame which holds the aperture plate in place, and provides an electrical contact to the insert.

The embodiment facilitates change of aperture plates in accordance with changes of the type of implant run. In some embodiments thermoelectric coolers may be associated with the aperture plates to keep them from over-heating. In other embodiments, an extension of cooled frame 10 or a separate cooled mounting frame is employed to support the aperture plate.

Universal Ion Source Controller

Figure 9:
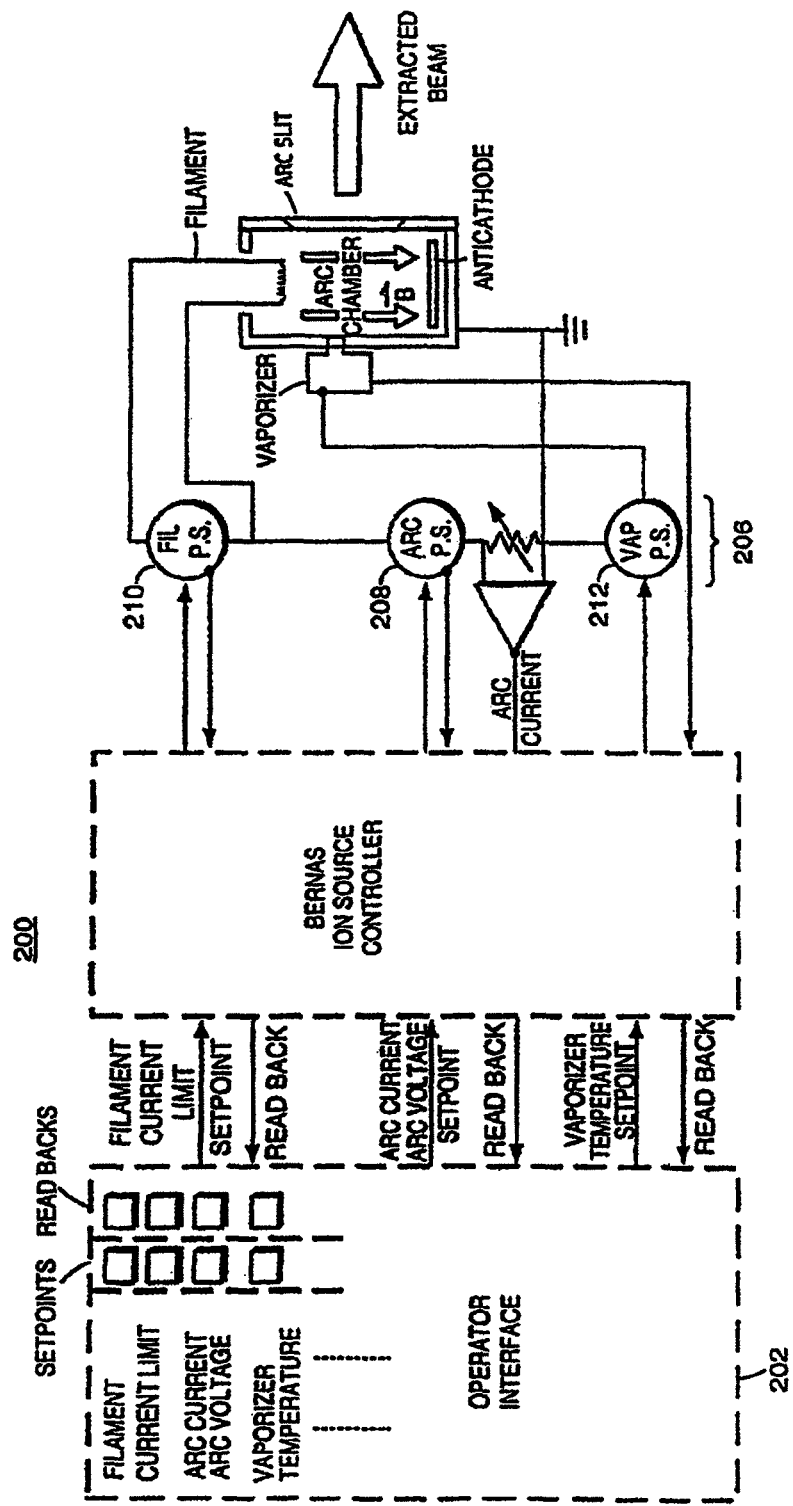

A universal controller for the ion source of the invention uniquely employs the user interface that is used with arc discharge ion sources such as the Bernas and Freeman types. FIG. 9 shows, in diagrammatic form, a typical control system 200 for operating a Bernas type ion source. The operator for such existing machines programs the implanter through an Operator Interface 202 (OI), which is a set of selectable graphical user interfaces (GUI's) that are selectively viewed on a computer screen. Certain parameters of the implanter are controlled directly from the OI, by either manually inputting data or by loading a predefined implant recipe file which contains the desired parameters that will run a specific implant recipe. The available set of GUI's includes controls and monitoring screens for the vacuum system, wafer handling, generation and loading of implant recipes, and ion beam control.

In many implanter systems, a predetermined set of ion source parameters is programmable through the Beam Control Screen of the OI represented in FIG. 9, including user-accessible setpoint values for Arc Current, Arc Voltage, Filament Current Limit, and Vaporizer Temperature. In addition to these setpoints, the actual values of the same parameters (for example, as indicated by the power supply readings) are read back and displayed to the operator on the OI by the control system.

Many other parameters that relate to the initial set up of the beam for a given implant are programmed and/or displayed through the Beam Screen GUI, but are not considered part of the operator's ion source control. These include beam energy, beam current, desired amount of the ion, extraction electrode voltages, vacuum level in the ion source housing, etc.

As indicated in FIG. 9, a dedicated Ion Source Controller 204 reads and processes the input (setpoint) values from the OI, provides the appropriate programming signals to the stack of power supplies 206, and also provides read backs from the power supplies to the OI. A typical power supply stack 206 shown in FIG. 9, includes power supplies for the Arc, Filament, and Vaporizer Heater, power supplies 208, 210 and 212, respectively. The programming and power generation for the Source Magnet Current may be provided in the screen, but is typically provided separate from the Ion Source Controller in many machines of the presently installed fleet.

Figure 9A:
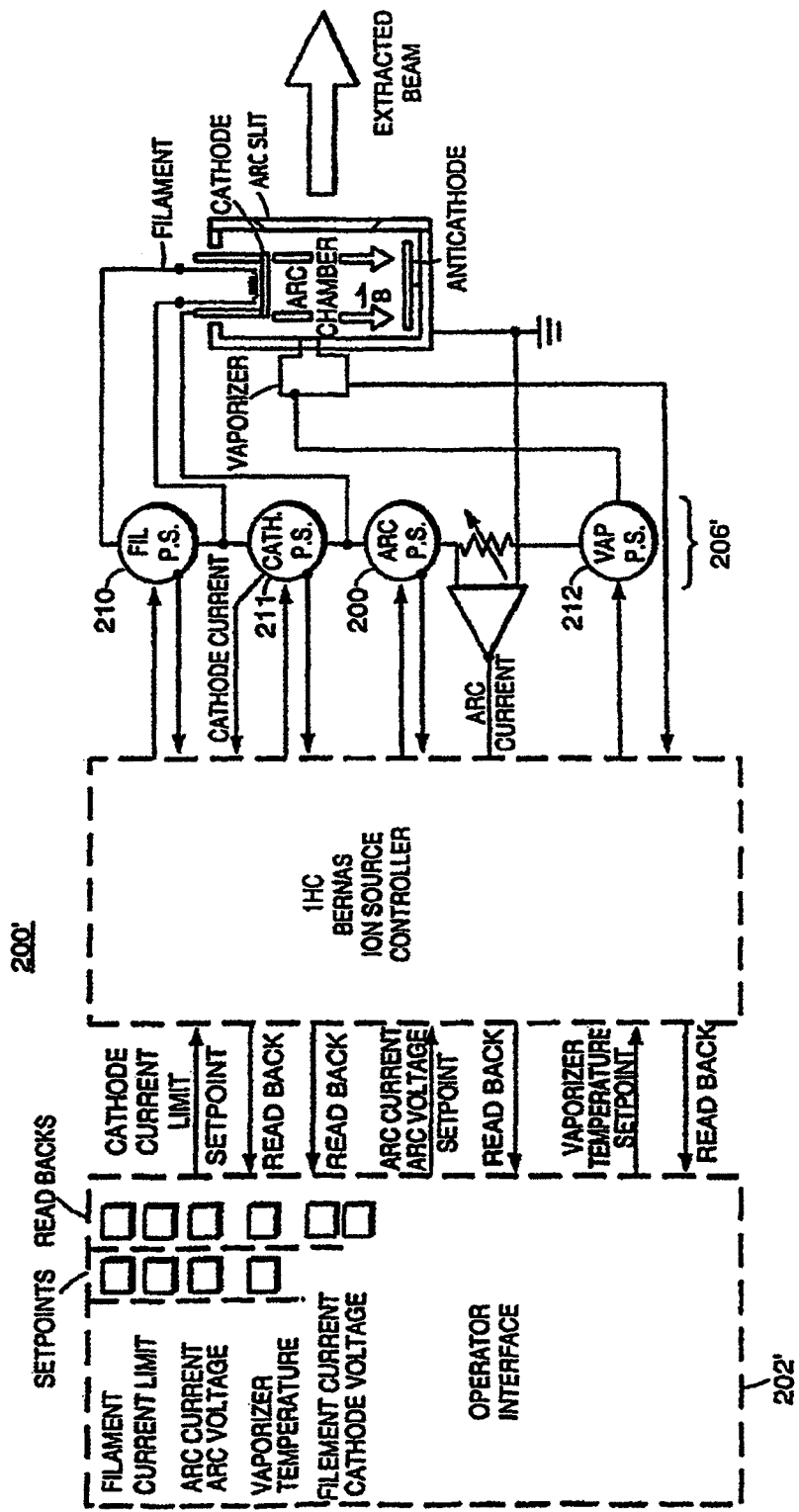
FIG. 9A is a similar view of a Bernas source with indirectly heated cathode.

FIG. 9*a* shows the same elements as FIG. 9, but for a Bernas-style ion source of the kind which uses an indirectly-heated cathode (IHC). FIG. 9*a* is identical to FIG. 9, except for the addition of a Cathode power supply 211, and its read back voltage and current. The additional power supply is necessary because the IHC (indirectly heated cathode element) is held at a positive high voltage with respect to the filament, which heats the IHC by electron bombardment to a temperature sufficient that the IHC emits an electron current equal to the Arc Current setpoint value provided through the OI. The arc control is accomplished through a closed-loop control circuit contained within the Ion Source Controller.

In general, the arc control of Bernas, Freeman, and IHC Bernas sources are accomplished through similar means, namely by on-board closed-loop control circuits contained within the Ion Source Controller. In order to physically retrofit the ion source of an existing ion implanter with an ion source of the present invention, the original ion source is removed from the source housing of the implanter, the power cables are removed, and the Ion Source Controller 204 and the power supplies 206 or 206.sup.1, i.e. the Filament Power Supply, Vaporizer Power Supply, Arc Power Supply, and Cathode Power Supply (if present) are removed from the gas box of the implanter. The Electron Beam Ion Source 1 of the present invention is inserted into the retrofit volume of the implanter, and the Electron Beam Ion Source Controller 220 and associated Power Supplies 207 are inserted into the vacated volume of the gas box. A new set of cables is connected. The desired mechanical configuration of the ion source is prepared prior to installation into the source housing of the implanter. For example, for decaborane production, a large width ion extraction aperture and a large dimension limiting aperture at the exit of the electron gun can be installed, to provide a large ionization volume. Additionally, if the implanter has installed a variable-width mass resolving aperture 44, the width of that aperture may be increased in order to pass a larger mass range of decaborane ions. Otherwise, the set-up proceeds in a conventional manner, modified according to the various features that are explained in the present text.

In addition to the electron beam controls that have just been explained, a temperature control mechanism is provided for the vaporizer 2. The vaporizer is held at a well-defined temperature by a closed-loop temperature control system within the Controller 220. As has been explained above, the closed-loop temperature control system incorporates PID (Proportional Integral Differential) control methodology, as is known in the art. The PID controller accepts a temperature setpoint and activates a resistive heater (which is mounted to a heater plate in contact with the water bath (see FIG. 3), or in heat transfer relationship with the mass of the vaporizer body 29 (FIG. 3A) to reach and maintain its setpoint temperature through a thermocouple read back circuit. The circuit compares the setpoint and read back values to determine the proper value of current to pass through the resistive heater. To ensure good temperature stability, a water-cooled heat exchanger coil 21 is immersed in the water bath (in the case of the water-cooled vaporizer of FIG. 3), or a thermoelectric (TE) cooler 30 (in the embodiment of a solid metal vaporizer of FIG. 3A), or a heat-exchanger coil surrounded by heat-conducting gas (in the embodiment of a vaporizer utilizing pressurized gas to accomplish thermal conduction between the various elements as in FIG. 3F) to continually remove heat from the system, which reduces the settling time of the temperature control system. Such a temperature control system is stable from 20 C to 200 C. In this embodiment, the flow of gas from the vaporizer to the ionization chamber is determined by the vaporizer temperature, such that at higher temperatures, higher flow rates are achieved. A similar temperature control system can be employed to control the temperature of conductive block 5a of FIG. 3E or 9B.

As has also previously been explained, in another embodiment a different vaporizer PID temperature controller is employed. In order to establish a repeatable and stable flow, the vaporizer PID temperature controller receives the output of an ionization-type pressure gauge which is typically located in the source housing of commercial ion implanters to monitor the sub-atmospheric pressure in the source housing. Since the pressure gauge output is proportional to the gas flow into the ion source, it output can be employed as the controlling input to the PID temperature controller. The PID temperature controller can subsequently raise or diminish the vaporizer temperature, to increase or decrease gas flow into the source, until the desired gauge pressure is attained. Thus, two useful operating modes of a PID controller are defined: temperature-based, and pressure-based.

In the embodiments of FIGS. 3 and 3A, temperature of the ionization chamber is controlled by the temperature of the vaporizer. Temperature control for the embodiment of FIG. 3E is achieved by a separate temperature sensing and control unit to control the temperature of the metal heat sink by use of a heat transfer medium or thermoelectric coolers or both.

Calculations of Expected Ion Current

The levels of ion current production that can be achieved with this new ion source technology are of great interest. Since the ion source uses electron-impact ionization by energetic primary electrons in a well-defined sizeable ionization region defined by the volume occupied by the broad electron beam in traversing the ionization chamber, its ion production efficiency can be calculated within the formalism of atomic physics: $I = I_0[1-\exp\{-n\,l\,s\}]$ (3) where $I_0$ is the incident electron current, $I$ is the electron current affected by a reaction having cross section $s$, $n$ is the number density of neutral gas molecules within the ionization volume, and $l$ is the path length. This equation can be expressed as follows: $f = 1-\exp\{-L\,s\,pl\}$ (4) [0269] where $f$ is the fraction of the electron beam effecting ionization of the gas, $L$ is the number density per Torr of the gas molecules at 0 C ($=3.538 \times 10^{16}$ Torr$^{-1}$ cm$^{-3}$), $s$ is the ionization cross section of the specific gas species in cm$^2$, and $pl$ is the pressure-path length product in Torr–cm.

The peak non-dissociative ionization cross section of decaborane has not been published, so far as the inventor is aware. However, it should be similar to that of hexane ($C_6H_{14}$), for example, which is known to be about $1.3 \times 10^{-15}$ cm$^2$. For an ion source extraction aperture 5 cm long and an ionization chamber pressure of $2 \times 10^{-3}$ Torr, equation (2) yields $f = 0.37$. This means that under the assumptions of these calculations described below, 37% of the electrons in the electron current produce decaborane ions by single electron collisions with decaborane molecules. The ion current (ions/sec) produced within the ionization volume can be calculated as: $I_{ion} = f I_{el}$ (5) [0271] where $I_{ion}$ is the ion current, and $I_{el}$ is the electron current traversing the ionization volume. In order to maximize the fraction of ion current extracted from the ion source to form the ion beam, it is important that the profile of the electron beam approximately matches in width the profile of the ion extraction aperture, and that the ions are produced in a region close to the aperture. In addition, the electron current density within the electron beam should be kept low enough so that the probability of multiple ionizations, not taken into account by equations (3) and (4), is not significant.

The electron beam current required to generate a beam of decaborane ions can be calculated as: $I_{el} = I_{ion}/f$ (6)

Given the following assumptions: a) the decaborane ions are produced through single collisions with primary electrons, b) both the gas density and the ion density are low enough so that ion-ion and ion-neutral charge-exchange interactions do not occur to a significant degree, e.g., gas density $<10^{14}$ cm$^{-3}$ and ion density $<10^{11}$ cm$^{-3}$, respectively, and c) all the ions produced are collected into the beam. For a 1 mA beam of decaborane ions, equation (6) yields $I_{el}=2.7$ mA. Since electron beam guns can be constructed to produce electron current densities on the order of 20 mA/cm$^2$, a 2.7 mA electron beam current appears readily achievable with the electron beam gun designs described in this application.

The density of primary electrons $n_e$ within the ionization volume is given by: $n_e = J_e/e\, v_e$ (7) [0275] where e is the electronic charge ($=1.6\times10^{-19}$ C), and $v_e$ is the primary electron velocity. Thus, for a 100 eV, 20 mA electron beam of 1 cm$^2$ cross-sectional area, corresponding to a relatively wide ion extraction aperture as illustrated in FIG. 4F, equation (7) yields $n_e \approx 2\times10^{10}$ cm$^{-3}$. For a narrow extraction aperture, as illustrated in FIG. 5, a 100 eV, 20 mA of 0.4 cm$^2$ cross-sectional area would provide an electron density $n_e \approx 5\times10^{10}$ cm$^{-3}$. Since the ion density, $n_i$ within the ionization volume will likely be of the same order of magnitude as $n_e$, it is reasonable to expect $n_i < 10^{11}$ cm$^{-3}$. It is worth noting that since $n_e$ and $n_i$ are expected to be of similar magnitude, some degree of charge neutrality is accomplished within the ionization volume due to the ionizing electron beam and ions being of opposite charge. This measure of charge neutrality helps compensate the coulomb forces within the ionization volume, enabling higher values of $n_e$ and $n_i$, and reducing charge-exchange interactions between the ions.

An important further consideration in determining expected extraction current levels from the broad, collimated electron beam mode is the Child-Langmuir limit, that is, the maximum space charge-limited ion current density which can be utilized by the extraction optics of the ion implanter. Although this limit depends somewhat on the design of the implanter optics, it can usefully be approximated as follows: $J_{max} = 1.72\,(Q/A)^{1/2}\,U^{3/2}d^{-2}$ (8) [0277] where $J_{max}$ is in mA/cm$^2$, Q is the ion charge state, A is the ion mass in amu, U is the extraction voltage in kV, and d is the gap width in cm. For $B_{10}H_x^+$ ions at 117 amu extracted at 5 kV from an extraction gap of 6 mm, equation (6) yields $J_{max} = 5$ mA/cm$^2$. If we further assume that the area of the ion extraction aperture is 1 cm$^2$, we deduce a Child-Langmuir limit of 5 mA of $B_{10}H_x^+$ ions at 5 keV, which comfortably exceeds the extraction requirements detailed in the above discussion. Ion Extraction Aperture Considerations for the Broad, Aligned Beam Electron Gun Ion Source For the broad electron beam ion source, it is possible to employ a larger width ion extraction aperture than typically employed with high current Bernas arc discharge sources. Ion implanter beam lines are designed to image the extraction aperture onto the mass resolving aperture, which is sized to both achieve good transmission efficiency downstream of the mass resolving aperture, and also to maintain a specified mass resolution R ($\equiv M/\Delta M$, see discussion above). The optics of many high-current beam lines employ unity magnification, so that, in the absence of aberrations, the extent of the ion extraction aperture as imaged onto the resolving aperture is approximately one-to-one, i.e., a mass resolving aperture of the same width as the ion extraction aperture will pass nearly all the beam current of a given mass-to-charge ratio ion transported to it. At low energies, however, space charge forces and stray electromagnetic fields of a Bernas ion source cause both an expansion of the beam as imaged onto the mass resolving aperture, and also a degradation of the mass resolution achieved, by causing significant overlap of adjacent beams of different mass-to-charge ratio ions dispersed by the analyzer magnet.

In contrast, in the ion source the absence of a magnetic field in the extraction region, and the lower total ion current level desired, e.g. for decaborane relative say to boron, uniquely cooperate to produce a much improved beam emittance with lower aberrations. For a given mass resolving aperture dimension, this results in higher transmission of the decaborane beam through the mass resolving aperture than one might expect, as well as preserving a higher R. Therefore, the incorporation of a wider ion extraction aperture may not noticeably degrade the performance of the beam optics, or the mass resolution of the implanter. Indeed, with a wider aperture operation of the novel ion source can be enhanced, 1) because of the greater openness of the wider aperture, the extraction field of the extraction electrode will penetrate farther into the ionization volume of the ionization chamber, improving ion extraction efficiency, and 2) it will enable use of a relatively large volume ionization region. These cooperate to improve ion production and reduce the required density of ions within the ionization volume to make the ion source of the invention production worthy in many instances.

Care can be taken, however, not to negatively impact the performance of the extraction optics of the implanter. For example, the validity of equation (8) can suffer if the extraction aperture width w is too large relative to the extraction gap d. By adding the preferred constraint that w is generally equal to or less than d, then for the example given above in which d=6 mm, one can use a 6 mm aperture as a means to increase total extracted ion current.

For retrofit installations, advantage can also be taken of the fact that many installed ion implanters feature a variable-width mass resolving aperture, which can be employed to open wider the mass resolving aperture to further increase the current of decaborane ions transported to the wafer. Since it has been demonstrated that in many cases it is not necessary to discriminate between the various hydrides of the $B_{10}H_x^+$ ion to accomplish a well-defined shallow p-n junction (since the variation in junction depth created by the range of hydride masses is small compared to the spread in junction location created by boron diffusion during the post-implant anneal), a range of masses may be passed by the resolving aperture to increase ion yield. For example, passing $B_{10}H_5^+$ through $B_{10}H_{12}^+$ (approximately 113 amu through 120 amu) in many instances will not have a significant process impact relative to passing a single hydride such as $B_{10}H_8^+$, and yet enables higher dose rates. Hence, a mass resolution R of 16 can be employed to accomplish the above example without introducing deleterious effects. Decreasing R through an adjustable resolving aperture can be arranged not to introduce unwanted cross-contamination of the other species (e.g., As and P) which may be present in the ion source, since the mass range while running decaborane is much higher than these species. In the event of operating an ion source whose ionization chamber has been exposed to In (113 and 115 amu), the analyzer magnet can be adjusted to pass higher mass $B_{10}H_x^+$ or even lower mass $B_9H_x^+$ molecular ions, in conjunction with a properly sized resolving aperture, to ensure that In is not passed to the wafer.

Furthermore, because of the relatively high concentration of the desired ion species of interest in the broad electron beam ion source, and the relatively low concentration of other species that contribute to the total extracted current (reducing beam blow-up), then, though the extracted current may be low in comparison to a Bernas source, a relatively higher percentage of the extracted current can reach the wafer and be implanted as desired.

Benefits of Using Hydride Feed Gases, Etc.

Beam currents obtainable with the broad electron beam ion source described can be maximized by using feed gas species which have large ionization cross sections. Decaborane falls into this category, as do many other hydride gases. While arc plasma-based ion sources, such as the enhanced Bernas source, efficiently dissociate tightly-bound molecular species such as $BF_3$, they tend to decompose hydrides such as decaborane, diborane, germane, and silane as well as trimethyl indium, for example, and generally are not production-worthy with respect to these materials. It is recognized, according to the invention, however that these materials and other hydrides such as phosphene and arsine are materials well-suited to the ion source described here (and do not present the fluorine contamination problems encountered with conventional fluorides). The use of these materials to produce the ion beams for the CMOS applications discussed below, using the ion source principles described.

For example, phosphene can be considered. Phosphene has a peak ionization cross section of approximately $5 \times 10^{-16}$ cm$^2$. From the calculations above, equation (6) indicates that a broad, collimated electron beam current of 6.2 mA should yield an ion current of 1 mA of $AsH_x^+$ ions. The other hydrides and other materials mentioned have ionization cross sections similar to that of phosphene, hence under the above assumptions, the ion source should produce 1 mA for all the species listed above with an electron beam current of less than 7 mA. On the further assumption that the transmission of the implanter is only 50%, the maximum electron beam current required would be 14 mA, which is clearly within the scope of electron beam current available from current technology applied to the specific embodiments presented above.

It follows from the preceding discussion that ion currents as high as 2.6 mA can be transported through the implanter using conventional ion implanter technology. According to the invention, for instance, the following implants can be realized using the indicated feed materials in an ion source of the present invention: TABLE-US-00003 Low energy boron: vaporized decaborane ($B_{10}H_{14}$) Medium energy boron: gaseous diborane ($B_2H_6$) Arsenic: gaseous arsine ($AsH_3$) Phosphorus: gaseous phosphene ($PH_3$) Indium: vaporized trimethyl indium $In(CH_3)_3$ Germanium: gaseous germane ($GeH_4$) Silicon: gaseous silane ($SiH_4$).

The following additional solid crystalline forms of In, most of which require lower vaporizer temperatures than can be stably and reliably produced in a conventional ion source vaporizer such as is in common use in ion implantation, can also be used in the vaporizer of the present invention to produce indium-bearing vapor: indium fluoride ($InF_3$), indium bromide (InBr), indium chloride (InCl and $InCl_3$), and indium hydroxide $\{In(OH)_3\}$. Also, antimony beams may be produced using the temperature-sensitive solids $Sb_{20}_5$, $SbBr_3$ and $SbCl_3$ in the vaporizer of the present invention.

In addition to the use of these materials, the present ion source employing the broad, aligned electron beam in a non-reflex mode of operation can ionize fluorinated gases including $BF_3$, $AsF_5$, $PF_3$, $GeF_4$, and $SbF_5$, at low but sometimes useful atomic ion currents through single ionizing collisions. The ions obtainable may have greater ion purity (due to minimization of multiple collisions), with lessened space charge problems, than that achieved in the higher currents produced by Bernas sources through multiple ionizations. Furthermore, in embodiments of the present invention constructed for multimode operation, all of the foregoing can be achieved in the broad, aligned electron beam mode, without reflex geometry or the presence of a large magnetic confining field, while, by switching to a reflex geometry and employing a suitable magnetic field, a level of arc plasma can be developed to enhance the operation in respect of some of the feed materials that are more difficult to ionize or to obtain higher, albeit less pure, ion currents.

To switch between non-reflex and reflex mode, the user can operate controls which switch the beam dump structure from a positive voltage (for broad, aligned electron beam mode) to a negative voltage approaching that of the electron gun, to serve as a reseller (anticathode) while also activating the magnet coils 54. The coils, conventionally, are already present in the implanters originally designed for a Bernas ion source, into which the present ion source can be retrofit. Thus a multi-mode version of the present ion source can be converted to operate with an arc plasma discharge (in the case of a short electron gun in which the emitter is close to the ionization volume as in FIGS. 4A-4D), in a manner similar to a Bernas source of the reflex type, or with a plasma without an active arc discharge if the emitter is remote from the ionization volume. In the embodiment described previously the existing magnet coils can be removed and modified magnet coils provided which are compatible with the geometry of a retrofitted, long, direct-injection electron gun. When these magnet coils are energized, the resultant axial magnetic field can confine the primary electron beam (both within the electron gun and in the ionization chamber) to a narrower cross-section, reducing the spreading of the electron beam profile due to space charge, and increasing the maximum amount of useful electron current which can be injected into the ionization volume. Since the electron emitter of this embodiment is remote from the ionization chamber, it will not initiate an arc discharge, but depending on the strength of the external magnetic field, will provide a low-density plasma within the ionization region. If the plasma density is low enough, multiple ionizations induced by secondary electron collisions with the ions should not be significant; however, the presence of a low-density plasma may enhance the space charge neutrality of the ionization region, enabling higher ion beam currents to be realized.

Benefits of Using Dimer-Containing Feed Materials

The low-temperature vaporizer of the present invention can advantageously use, in addition to the materials already mentioned, other temperature-sensitive solid source materials which cannot reliably be used in currently available commercial ion sources due to their low melting point, and consequently high vapor pressure at temperatures below 200 C. I have realized that solids which contain dimers of the dopant elements As, In, P, and Sb are useful in the ion source and methods presented here. In some cases, vapors of the temperature-sensitive dimer-containing compounds are utilized in the ionization chamber to produce monomer ions. In other cases, the cracking pattern enables production of dimer ions. Even in the case of dimer-containing oxides, in certain cases, the oxygen can be successfully removed while preserving the dimer structure. Use of dimer implantation from these materials can reap significant improvements to the dose rate of dopants implanted into the target substrates.

By extension of equation (8) which quantifies the space charge effects which limit ion extraction from the ion source, the following figure of merit which describes the easing of the limitations introduced by space charge in the case of molecular implantation, relative to monatomic implantation, can be expressed:

$$\Delta = n(V_1/V_2)^{3/2}(m_1/m_2)^{-1/2} \quad (9)$$

where $\Delta$ is the relative improvement in dose rate achieved by implanting a molecular compound of mass $m_1$ and containing n atoms of the dopant of interest at an accelerating potential $V_1$, relative to a monatomic implant of an atom of mass $m_2$ at an accelerating potential $V_2$. In the case where $V_1$ is adjusted to give the same implantation depth into the substrate as the monomer implant, equation (9) reduces to $\Delta = n^2$. For dimer implantation (e.g., $As_2$ versus As), $\Delta = 4$. Thus, up to a fourfold increase in dose rate can be achieved through dimer implantation. Table Ia below lists materials suitable for dimer implantation as applied to the present invention.

TABLE IA

| Compound | Melting Pt (deg C.) | Dopant | Phase |
|---|---|---|---|
| $As_2O_3$ | 315 | $As_2$ | Solid |
| $P_2O_5$ | 340 | $P_2$ | Solid |
| $B_2H_6$ | | $B_2$ | Gas |
| $In_2(SO_4)_3 \cdot xH_2O$ | 250 | $In_2$ | Solid |
| $Sb_2O_5$ | 380 | $Sb_2$ | Solid |

Where monomer implantation is desired, the same dimer-containing feed material can advantageously be used, by adjusting the mode of operation of the ion source, or the parameters of its operation to sufficiently break doan the molecules to produce useful concentrations of monomer ions. Since the materials listed in Table Ia contain a high percentage of the species of interest for doping, a useful beam current of monomer dopant ions can be obtained.

Use of the Ion Source in CMOS Ion Implant Applications

Figure 10:
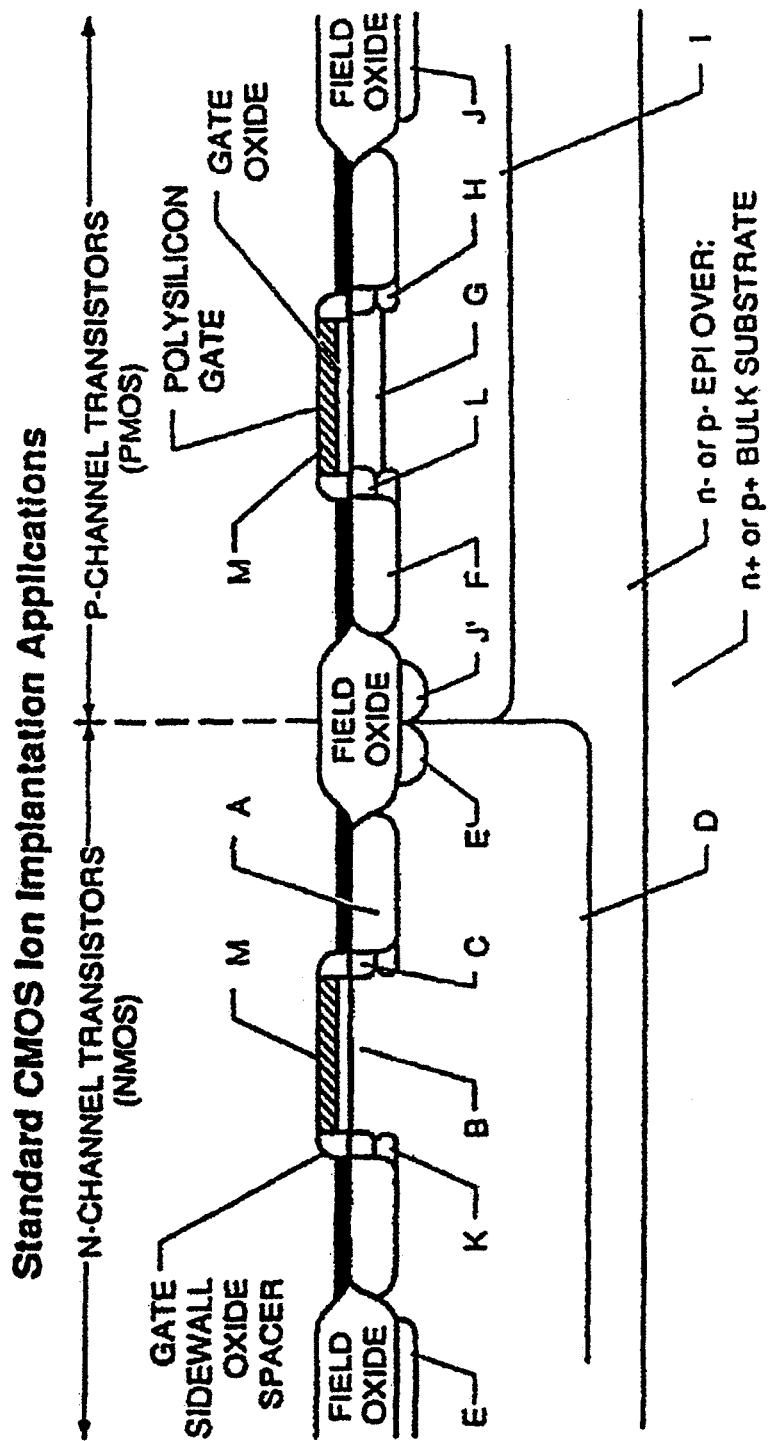
FIG. 10 is a diagrammatic illustration of a semiconductor device, illustrating standard CMOS ion implantation applications.

In present practice, ion implantation is utilized in many of the process steps to manufacture CMOS devices, both in leading edge and traditional CMOS device architectures. FIG. 10 illustrates a generic CMOS architecture and labels traditional implant applications used in fabricating features of the transistor structures (from R. Simonton and F. Sinclair, Applications in CMOS Process Technology, in Handbook of Ion Implantation Technology, J. F. Ziegler, Editor, North-Holland, N.Y., 1992). The implants corresponding to these labeled structures are listed in Table I below, showing the typical dopant species, ion energy, and dose requirements which the industry expects to be in production in 2001.

TABLE I

| Label | Implant | Specie | Energy (keV) | Dose (cm$^{-2}$) |
|---|---|---|---|---|
| A | NMOS source/drain | As | 30-50 | 1e15-5e15 |
| B | NMOS threshold adjust (V.sub.t) | P | 20-80 | 2e12-1e13 |
| C | NMOS LDD or drain | P | 20-50 | 1e14-8e14 |
| D | extension p-well (tub) structure | B | 100-300 | 1e13-1e14 |
| E | p-type channel stop | B | 2.0-6 | 2e13-6e13 |
| F | PMOS source/drain | B | 2.0-8 | 1e15-6e15 |
| G | PMOS buried-channel V.sub.t | B | 10-30 | 2e12-1e13 |
| H | PMOS punchthrough suppression | P | 50-100 | 2e12-1e13 |
| I | n-well (tub) structure | P | 300-500 | 1e13-5e13 |
| J | n-type channel stop | As | 40-80 | 2e13-6e13 |
| K | NMOS punchthrough suppression | B | 20-50 | 5e12-2e13 |
| L | PMOS LDD or drain extension | B | 0.5-5 | 1e14-8e14 |
| M | Polysilicon gate doping | As, B | 2.0-20 | 2e15-8e15 |

In addition to the implants listed in Table I, recent process developments include use of C implants for gettering, use of Ge or Si for damage implants to reduce channeling, and use of medium-current In and Sb. It is clear from Table I that, apart from creating the source/drains and extensions, and doping the polysilicon gate, all other implants require only low or medium-dose implants, i.e. doses between $2 \times 10^{12}$ and $1 \times 10^{14}$ cm$^{-2}$. Since the ion current required to meet a specific wafer throughput scales with the desired implanted dose, it seems clear that these low and medium-dose implants can be performed with the broad, aligned electron beam ion source of the present invention at high wafer throughput with ion beam currents below 1 mA of P, As, and B. Further, of course, the decaborane ion currents achievable according to the present invention should enable producing the p-type source/drains and extensions, as well as p-type doping of the polysilicon gates.

It is therefore believed that the broad, aligned electron beam ion source described above enables high wafer throughputs in the vast majority of traditional ion implantation applications by providing a beam current of 1 mA of $B_{10}H_{14}$, As, P, and B or $B_2$. The addition of Ge, Si, Sb, and In beams in this current range, also achievable with the present invention, will enable more recent implant applications not listed in Table I.

Description of External Cathode Ion Source

Figure 13:
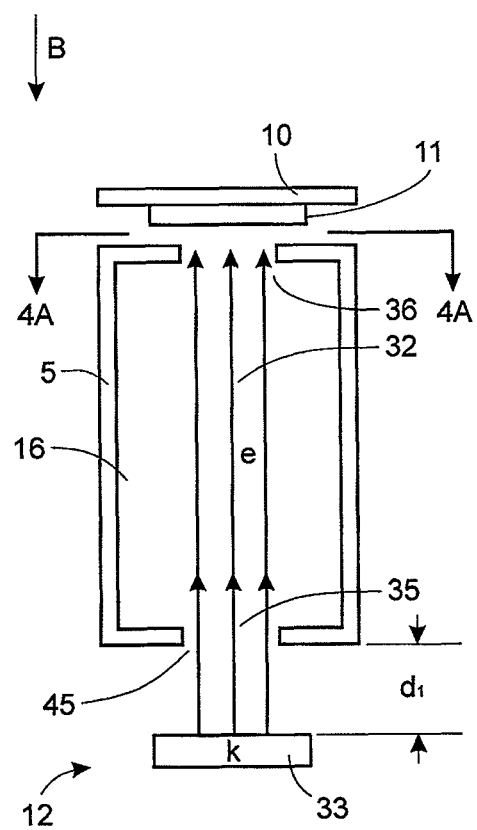
FIG. 13 is a cut-away view of an ion source configured with an external cathode in accordance with the present invention showing the electron flow from the external cathode through the ionization chamber to a beam dump or repeller.
Figure 14:
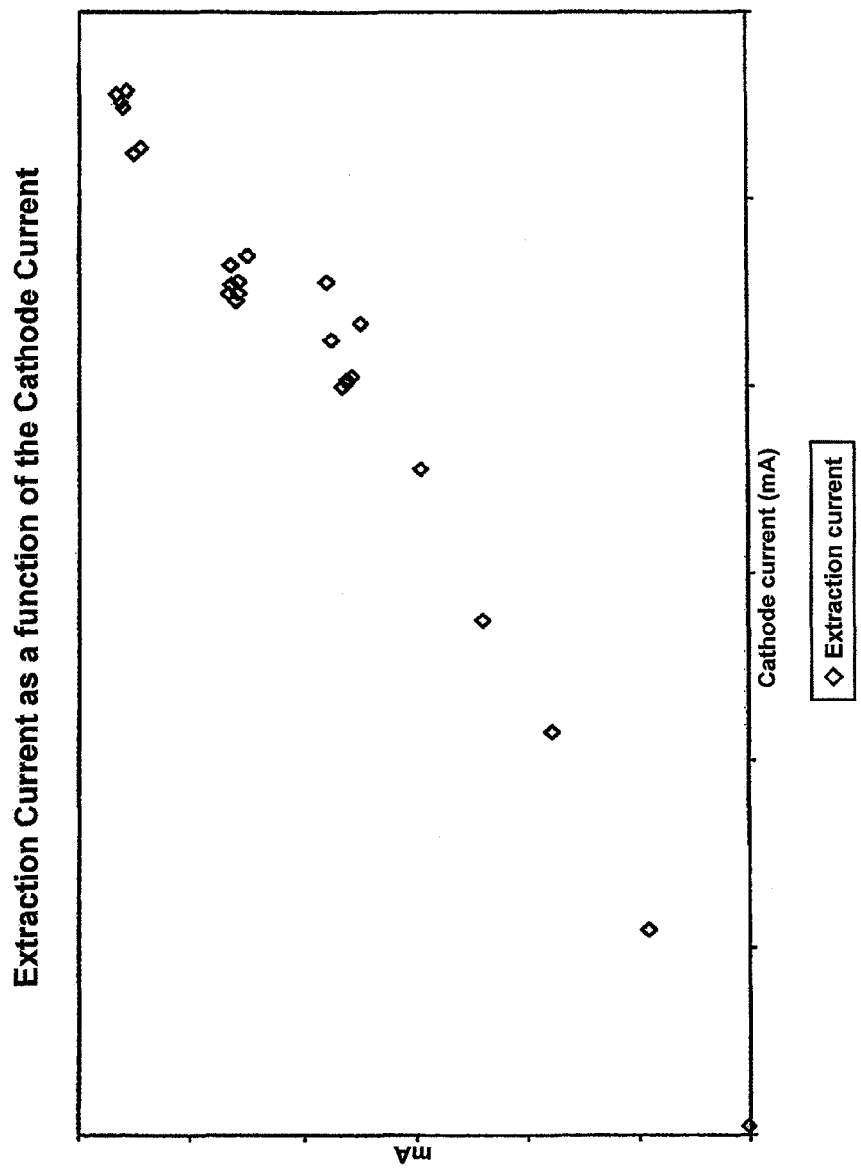
FIG. 14 is a graphical illustration of the extraction current as a function of the external cathode current for the embodiment illustrated in FIG. 13.

Features of a further embodiment of the invention are shown in FIG. 13. In this embodiment, reference is made to the electron gun in which the emitter is close to the ionization volume as in FIGS. 4A-4D. However; a feature of this embodiment in contrast to FIGS. 3 and 4A-4D. More specifically, in contrast to known embodiments of ion sources which include electron emitters that include electron optics and/or an anode 34, as illustrated in FIGS. 4A 4D, the embodiment of the invention illustrated in FIGS. 4A-4D eliminates the need for an anode or other electron optics. Accordingly, in this embodiment of the invention, the electron gun 12 and specifically cathode emitter 33 may be located closer to the ionization volume than known ion sources, for example as illustrated in FIGS. 4A-4D forming a broad electron beam, consisting of dispersed electrons. In addition, a static or dynamic magnetic field B may be employed, e.g., by means of a permanent magnet or magnetic coils (not shown), as is known in the art.

As shown in FIG. 13, the ion source 12 including the cathode 33 are immersed in a magnetic field B in a direction as shown by the arrow in the plane of the figure and transverse to the beam extraction direction which is perpendicular to the plane of the figure. It should be noted that the magnetic field direction can be opposite to the direction shown.

In the embodiment of the invention shown in FIG. 13, the cathode 33 sits outside the ionization chamber volume. With such a configuration, the magnetic field traps the electrons emitted from the cathode 33 forming a column of electrons thus permitting operation without the electron optics. In particular, an electron beam is emitted from the cathode 33 and accelerated over the cathode-source gap, i.e the gap between the cathode 33 and the ionization chamber 5 while being trapped by the B-field. The resulting electron beam gyrates along the B-field lines maintaining its shape until hitting the electron beam dump 11 at an opposing end of the ionization chamber. In this mode, electrons have a single pass through the ionization chamber. Alternatively, a magnetic repeller may be installed in the beam dump location. In such an embodiment, the magnetic repeller is magnetized in the same direction as the main source B-field. This produces a magnetic mirror from which electrons are reflected before hitting the beam dump. This enables most of the electrons to pass more than once through the ionization chamber thus improving the efficiency of the source.

Referring to FIG. 13, in operation, the electron beam 32 passes through an entrance port 45 in the ionization chamber 5 and interacts with the neutral gas within the open volume 16, defined within the ionization chamber body. The electron beam then passes directly through a exit port 36 in the ionization chamber 5 and is intercepted by the beam dump 11, which is mounted on the water-cooled mounting frame 10.

The beam dump 11 may be biased, positive or negative, relative to the electron gun 12, i.e. cathode 33, and to the walls of the ionization chamber 5 as well, as is known in the art. In addition, the beam dump 11 may be maintained at the same or negative potential relative to the electron gun 12 or may employ a magnetic field, such that in both instances the beam dump 11 acts as a repeller. Alternatively, the beam dump 11 may be electrically isolated from the ionization chamber 5 and allowed to float electrically. In this case, the beam dump 11 is self-biased by the electron beam to a voltage within a few volts of the cathode voltage, which determines the kinetic energy of the electron beam, as is also known in the art.

The cathode 33 may be an indirectly-heated cathode (IHC), or a directly heated filament. As is known in the art, the IHC element is held at a positive high voltage with respect to the filament, which heats the IHC by electron bombardment to a temperature sufficient for the IHC to emit an electron current.

Feed gas is introduced into the ionization chamber 5 through gas vias, for example, the vias 15 or 27 illustrated in FIG. 3, depending upon the gas to be ionized, i.e., a cluster molecule or a monatomic feed material. Once inside the chamber 16, the electron beam 32 interacts with the gas to produce the ions, cluster or monatomic.

The benefits of an anode free electron source as in the present invention include: a reduction in the source elements, elimination of the anode power supply, both of which reduce complexity of the design, improved transmission of the electron beam into the ionization chamber due to reduced electron beam space charge blow up, and elimination of failure modes associated with the anode held at a high positive voltage relative to the cathode, namely: a reduction in thermal loading of the anode, a reduction in glitches, that is, vacuum discharges between anode and chamber or anode and cathode; overloading of the anode voltage power supply and a reduction in electrical shorts associated with deposited material on or about the chamber entrance port 45 or the electron gun 12.

Figure 16:
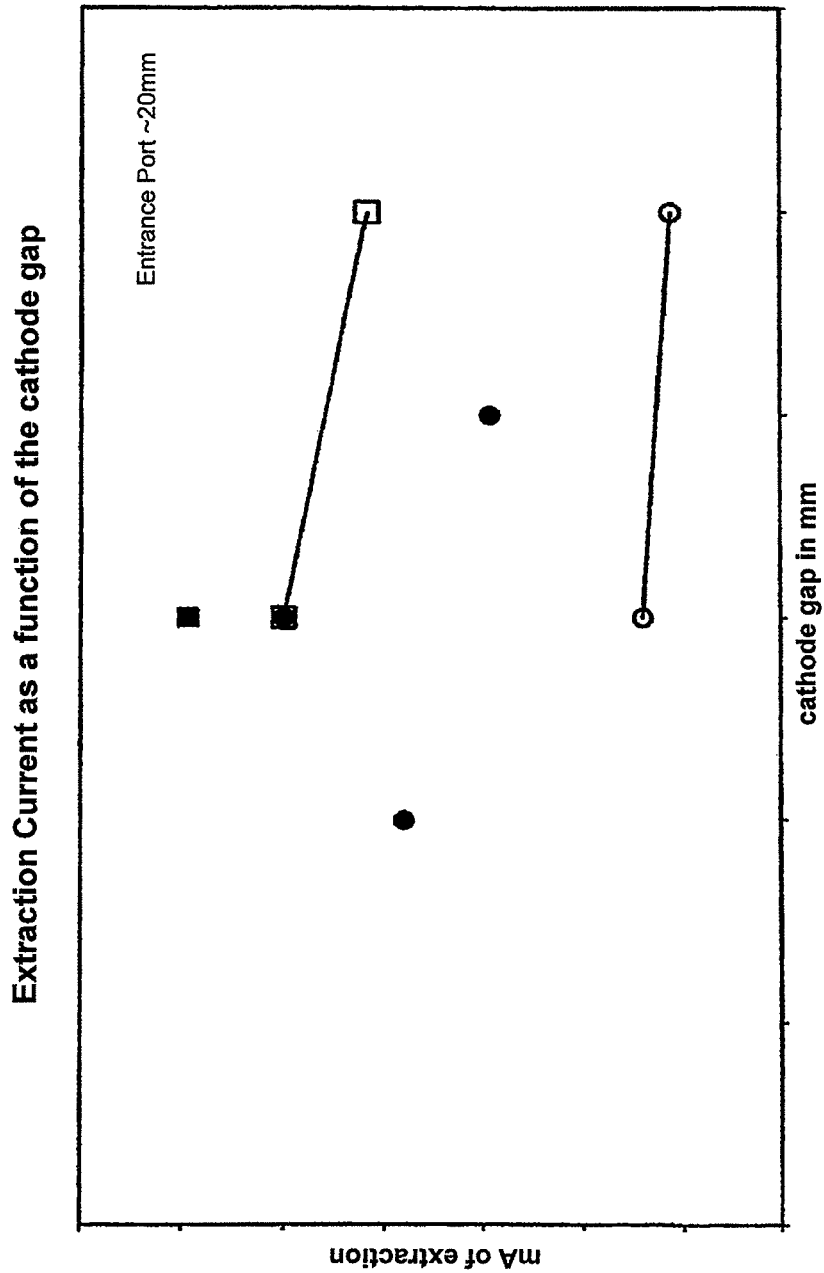
FIG. 16 is a graphical illustration of the extraction current as a function of the gap between the external cathode and the ionization chamber for different cathode currents for the embodiment illustrated in FIG. 13.

An advantageous feature of the present invention is that by placing the cathode external to the ionization chamber, but still being proximate to said chamber, for example at a separation, $d_1$, measured between the cathode 33 and the chamber 5, an extraction field between the cathode and ionization chamber can be established to efficiently extract and inject electrons into the ionization chamber, without the aid of intermediate electron optics. In this regard, a separation distance $d_1$ between the cathode 33 and the ionization chamber 5, substantially equal to the distance in known ion sources as illustrated in FIGS. 4A-4D between the electron optics or anodes and the ionization chamber 5, for example 3 millimeters or more, as illustrated in FIG. 16. Such a configuration produces sufficient electron current to produce the necessary ionized beam of cluster gas molecules for the ion system. More significantly, FIG. 22 shows that with the elimination of the electron optics of the present invention, the extraction current versus cathode electron current for a monomer gas is substantially linear.

Once a plasma is formed at the surface of the cathode, the electric field between cathode and ionization chamber will increase due to the formation of a plasma sheath. As established in the art, the plasma will settle at a potential within several volts of the ionization chamber potential. Since the sheath will be much narrower than the separation between cathode 33 and ionization chamber 5, the extraction field gradient increases. This allows a high extraction current which increases the ion beam current. Accordingly, the present invention is also able to generate a plasma or operate in an arc discharge mode and ionize suitable amounts of monomer feed gases as well as cluster molecule feed gases in a direct electron impact mode for commercial ion implantation depending on the separation distance d between the cathode 33 and the ionization chamber 5.

In accordance with a further advantageous feature of the present invention, is that by adjusting the separation distance $d_1$ of the cathode external to the ionization chamber with respect to the dimension of the entrance port $d_2$, applicants can affect the ionization current of monomer gases. Specifically, FIG. 16 shows the ionization current of a monomer gas versus the separation distance $d_1$. In this regard, a separation distance $d_1$ substantially less than the dimension $d_2$ of the entrance port 45, i.e., $d_1 < d_2$ produces improved monomer ion beam current. In this example, applicants have found that a separation distance of about 3 mm produces the optimum bean current for monomer gas.

Figure 15:
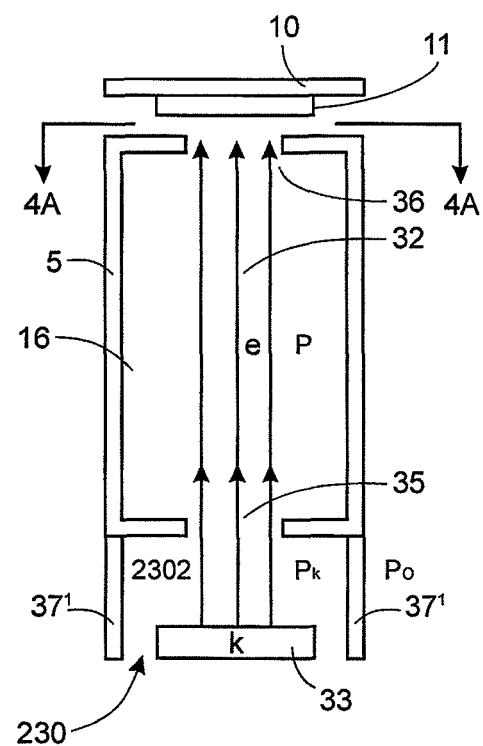
FIG. 15 is an alternate embodiment of the ion source illustrated in FIG. 13.

As explained above, an advantageous feature of the present invention is obtained by placing the cathode external to the ionization chamber, but still proximate to said chamber, for example at a separation distance $d_1$, an extraction field between the cathode 33 and ionization chamber 5 can be established to efficiently extract and inject electrons into the ionization chamber, without the aid of intermediate electron optics. In this case, an electron beam can be established. In some cases, it is also advantageous to inject plasma into the ionization chamber 5 in order to achieve a higher ion density, and hence higher ion beam currents. Since the external cathode 33 is necessarily in a rarified vacuum relative to the ionization chamber volume, conditions for creating a plasma are not typically met unless higher electron currents can be generated. Accordingly, in a further embodiment of the invention, this condition can be overcome by artificially raising the local pressure at the emitting surface of the cathode. A means to accomplish this is illustrated in FIG. 15 similar to FIG. 4. A wall member or baffle 37' is shown attached to ionization chamber 5 and partially surrounds cathode 33 to increase the localized pressure proximate to the cathode 33. The baffle 37' leaves an opening 2301 for the gas to flow to the vacuum pump (not shown). As is known in the art, the vacuum pump reduces the outside pressure $P_0$ to a level about 100 times lower than the pressure P within the ionization chamber, for example the pressure within the chamber P is on the order of $10^{-3}$ Torr, whereas the pressure outside the chamber is on the order of $P_0$ $10^{-5}$ Torr. Insertion of baffle 37' has the effect of limiting the conductance between the volume 2302 in the vicinity of the emitting surface of the cathode 33 and the pump 38', raising the pressure $P_k$ of the volume 2302 to a level $P_k > P_0$. By tailoring the geometry of the baffle or wall member 37' surrounding the cathode 33 to adjust its conductance, the pressure at the surface of cathode 33 can be adjusted to a given range. Raising the volume 2302 pressure $P_k$ will allow a plasma to form more readily, while reducing the pressure $P_k$ will restrict the formation of plasma. In this way, the onset of plasma formation which tends to characterize the transition from electron impact ionization to creation of a diffuse plasma discharge can be "tuned" for a given cathode and source geometry, while still maintaining the benefits of a remotely placed cathode.

Once a plasma is formed at the surface of the cathode, the electric field between cathode 33 and the ionization chamber will increase due to the formation of a plasma sheath. As established in the art, the plasma will settle at a potential within several volts of the ionization chamber potential. Since the sheath will be much narrower than the separation between cathode 33 and ionization chamber 5 of FIG. 15, the extraction field increases. This enables higher electron currents to be drawn from the cathode, increasing the plasma density, thus further narrowing the sheath. This "positive feedback"

mechanism for plasma production enables the onset of plasma formation to sensitively follow the local pressure at the surface of the cathode 33, making adjustment of this pressure by appropriate design of baffle 37' of particular utility when the higher current is required.

A magnetic field B, produced by a permanent magnet or energized coils (not shown), as disclosed above, is used in combination with this embodiment of the ion source 1, i.e., without the electron optics or anodes. The magnetic field B can confine the primary electron beam (both from the electron gun 12 and in the ionization chamber 16) to a narrowed cross-section, to reduce the spreading of the electron beam profile due to space charge, and increasing the maximum amount of useful electron current which can be injected into the ionization volume.

As discussed, these features of the embodiments of the invention as shown in FIGS. 13 through 17 have significant benefits other than those associated with for example, simplicity, improvement in beam transmission, elimination of shorting by material deposition, mentioned above, that allows an ion source to run in multiple modes: the first mode is electron impact and the second is a plasma discharge, similar to the prior art arc discharge. This has the advantage of allowing these embodiments of the ion source to produce high currents of conventional monomer, such as, As, P & B as well as ion beams of cluster molecules.

Figure 17:
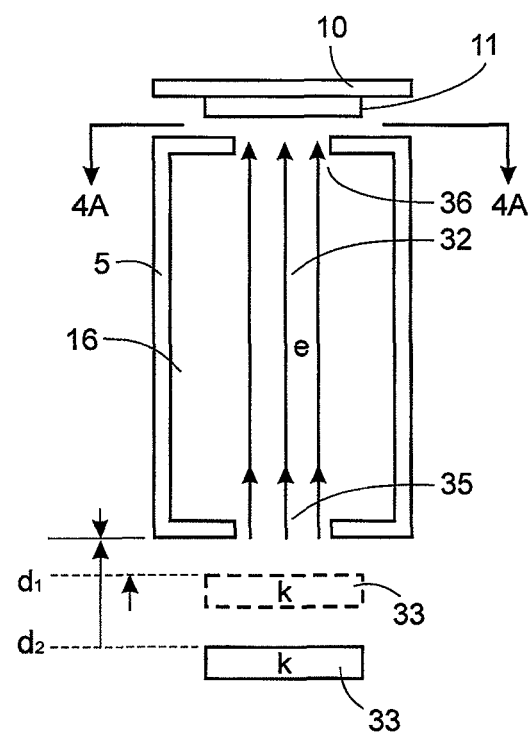
FIG. 17 is another alternate embodiment of the ion source illustrated in FIG. 13, illustrating the external cathode juxtaposed at a first position $d_1$ for operation of the ion source in a first mode of operation and also illustrating the cathode juxtaposed at a second position $d_2$ for operation of the ion source in a second mode of operation.

The fact that the ionization properties of the emitter change with the distance of the emitter 33 from the ionization chamber 5 can be exploited by incorporating a single emitter 33 which can be deployed such that its position is variable between a distance $d_1$ and $d_2$ from the ionization chamber. Alternatively, a single emitter 33 can be deployed whose position d is mechanically switchable between $d_1$ and $d_2$. FIG. 17 shows the latter embodiment, which is useful when switching between purely electron impact ionization (for molecular ion or cluster ion formation) and arc discharge plasma formation (for production of high currents of monomer ions) is desired. In this embodiment, cathode 33 could also extend into the ionization volume 16 of ionization chamber 5 to mimic the operation of a Bernas-style immersed cathode, as indicated in FIG. 17.

Obviously, many modifications and variations of the present invention are possible in light of the above teachings. Thus, it is to be understood that, within the scope of the appended claims, the invention may be practiced otherwise than as specifically described above.

We claim:

1. An ion source for use with an ion implant device, the ion source comprising:
   a. an ionization chamber having an extraction aperture and defining an opening through which electrons may flow into the ionization chamber;
   b. a gas source providing gas into the ionization chamber for ionization;
   c. a cathode disposed outside the ionization chamber and cooperating therewith; and
   d. a voltage supply for biasing the cathode with respect to the ionization chamber such that electrons from the cathode flow toward the ionization chamber and are directed into the ionization chamber through the opening to ionize the gas, wherein the distance between the cathode and the ionization chamber is variable; and
   wherein the cathode is mechanically switchable between a distance $d_1$ in which the ion source operates in arc discharge mode and a distance $d_2$ in which the ion source operates in a direct electron impact mode of operation.

2. An ion source emitter comprising:
   a. an ionization chamber having a first aperture for receiving a source of gas, a second aperture for permitting electrons to enter the ionization chamber that are generated outside the ionization chamber;
   b. an electron emitter for generating electrons, said electron emitter disposed outside the ionization chamber; and
   c. a voltage supply for biasing the electron emitter with respect to the ionization chamber so as to cause the electron emitter, to emit electrons into the ionization chamber, wherein the distance between said electron emitter and said ionization chamber is adjustable; and
   wherein the electron emitter is mechanically switchable between a distance $d_1$ in which the ion source operates in arc discharge mode and a distance $d_2$ in which the ion source operates in a direct electron impact mode of operation.

3. An ion source for use with an ion implant device, the ion source comprising:
   an ionization chamber having an electron entrance aperture;
   a source of feed gas in fluid communication with said ionization chamber; and
   an electron emitter formed from a cathode disposed outside said ionization chamber at a distance $d_1$ from said ionization chamber, wherein said distance $d_1$ is selected to cause a plasma to be generated, wherein said distance $d_1$ is adjustable; and
   wherein the electron emitter is mechanically switchable between a distance $d_1$ in which the ion source operates in arc discharge mode and a distance $d_2$ in which the ion source operates in a direct electron impact mode of operation.

4. The ion source as recited in claim 2, wherein said electron emitter is anode free.

5. The ion source as recited in claim 4, wherein said electron emitter is a cathode.

6. The ion source as recited in claim 5, wherein said cathode is a directly heated cathode.

7. The ion source as recited in claim 5, wherein said cathode is an indirectly heated cathode.

8. The ion source as recited in claim 4, wherein said electron emitter is a filament.

9. The ion source as recited in claim 2, further including a source for generating a magnetic field for confining the electrons generated by said electron emitter.

10. The ion source as recited in claim 5, further including further including a baffle surrounding the cathode to raise the local pressure surrounding the cathode.

11. The ion source as recited in claim 2, wherein the distance that electron emitter is adjustable enables said electron emitter to be adjusted so that said electron emitter extends into said ionization volume.

* * * * *

UNITED STATES PATENT AND TRADEMARK OFFICE
CERTIFICATE OF CORRECTION

| | |
|---|---|
| PATENT NO. | : 8,502,161 B2 |
| APPLICATION NO. | : 12/776636 |
| DATED | : August 6, 2013 |
| INVENTOR(S) | : Sami Hahto |

Page 1 of 2

It is certified that error appears in the above-identified patent and that said Letters Patent is hereby corrected as shown below:

In the Specification

Column 1
Line 18, Delete "Nov. 3," and insert -- Nov. 30, --, therefor.
Line 50, Delete "Indirectly" and insert -- indirectly --, therefor.

Column 2
Line 49, Delete "e*Vcath" and insert -- e*Vcathode --, therefor.

Column 4
Line 62, Delete "Helmholz" and insert -- Helmholtz --, therefor.

Column 5
Line 33, Delete "It" and insert -- it --, therefor.
Line 34, Delete "for," and insert -- for --, therefor.

Column 7
Line 24, Delete "source" and insert -- source. --, therefor.

Column 12
Line 6, Delete "Us" and insert -- L/s --, therefor.

Column 17
Line 11, Delete "rectangular:" and insert -- rectangular. --, therefor.
Line 25, Delete "sources." and insert -- sources, --, therefor.

Column 21
Line 2, Delete "that that" and insert -- at that --, therefor.

Signed and Sealed this
Fifth Day of August, 2014

Michelle K. Lee
*Deputy Director of the United States Patent and Trademark Office*

Column 22
Line 45, Delete "betaeen" and insert -- between --, therefor.

Column 25
Line 47, Delete "(1)" and insert -- (1). --, therefor.

Column 28
Line 24, Delete "(3)" and insert -- (3). --, therefor.
Line 60, Delete "(6)" and insert -- (6). --, therefor.

Column 29
Line 48, Delete "Source" and insert -- Source. --, therefor.

Column 33
Line 3, Delete "(9)" and insert -- (9). --, therefor.
Line 14, Delete "Ia" and insert -- IA --, therefor.
Line 18, Delete "sub.20." and insert -- sub.2O. --, therefor.
Line 18, Delete "6 B" and insert -- 6--B --, therefor.
Line 20, Delete "Solid" and insert -- Solid. --, therefor.
Line 24, Delete "doan" and insert -- down --, therefor.
Line 26, Delete "Ia" and insert -- IA --, therefor.
Line 45, Delete "1 e" and insert -- 1e --, therefor.
Line 46, Delete "1 e" and insert -- 1e --, therefor.
Line 54, Delete "8e15" and insert -- 8e15. --, therefor.

In the Claims

Column 38
Line 53-54, In Claim 10, delete "further including further including" and insert -- further including --, therefor.